(12) United States Patent
Hsiao et al.

(10) Patent No.: US 12,191,055 B2
(45) Date of Patent: Jan. 7, 2025

(54) METHOD FOR FABRICATING A MICRO RESISTANCE LAYER AND METHOD FOR FABRICATING A MICRO RESISTOR

(71) Applicant: YAGEO CORPORATION, Kaohsiung (TW)

(72) Inventors: Shen-Li Hsiao, Kaohsiung (TW); Chih-Wei Chi, Kaohsiung (TW)

(73) Assignee: YAGEO CORPORATION, Kaohsiung (TW)

( * ) Notice: Subject to any disclaimer, the term of this patent is extended or adjusted under 35 U.S.C. 154(b) by 359 days.

(21) Appl. No.: 17/654,818

(22) Filed: Mar. 15, 2022

(65) Prior Publication Data
US 2023/0207164 A1    Jun. 29, 2023

(30) Foreign Application Priority Data

Dec. 28, 2021   (TW) .................................. 110149006

(51) Int. Cl.
| | | |
|---|---|---|
| *H01L 21/00* | (2006.01) | |
| *B41M 3/00* | (2006.01) | |
| *C23C 14/34* | (2006.01) | |
| *H01C 17/065* | (2006.01) | |
| *H01C 17/28* | (2006.01) | |

(52) U.S. Cl.
CPC .......... *H01C 17/065* (2013.01); *B41M 3/006* (2013.01); *C23C 14/34* (2013.01); *H01C 17/281* (2013.01)

(58) Field of Classification Search
CPC ..... H01C 17/065; H01C 17/281; B41M 3/006
See application file for complete search history.

(56) References Cited

U.S. PATENT DOCUMENTS

| | | | | |
|---|---|---|---|---|
| 4,788,523 A | * | 11/1988 | Robbins | ............... H01C 17/006 |
| | | | | 338/203 |
| 5,169,493 A | * | 12/1992 | Nii | ........................ H01C 17/281 |
| | | | | 427/102 |
| 5,285,184 A | * | 2/1994 | Hatta | ...................... H01C 13/02 |
| | | | | 338/293 |

(Continued)

FOREIGN PATENT DOCUMENTS

| | | | | |
|---|---|---|---|---|
| CN | 1722316 B | * | 9/2010 | ............... H01C 1/14 |
| CN | 107785138 A | | 3/2018 | |

(Continued)

*Primary Examiner* — Laura M Menz
(74) *Attorney, Agent, or Firm* — CKC & Partners Co., LLC

(57) ABSTRACT

A method for fabricating a micro resistance layer and a method for fabricating a micro resistor are provided. The method for fabricating a micro resistance layer includes: providing a substrate; forming a first resistance layer on the substrate by using a screen printing process or a sputtering process; dividing the first resistance layer into second resistance layers, wherein each one of the product regions includes a second resistance layer, and an area of each one of the product regions is smaller than 0.4*0.2 mm$^2$; and trimming the second resistance layer of each one of the product regions according to a predetermined resistance value to enable the pattern of each one of the second resistance layers to correspond to the predetermined resistance value. The method for fabricating a micro resistor uses the method for fabricating a micro resistance layer for fabrication of the micro resistor.

15 Claims, 28 Drawing Sheets

(56) References Cited

U.S. PATENT DOCUMENTS

| | | | | |
|---|---|---|---|---|
| 5,976,392 | A * | 11/1999 | Chen | H01C 17/28 427/419.7 |
| 6,322,711 | B1 * | 11/2001 | Chen | H01L 28/20 427/419.7 |
| 6,856,235 | B2 * | 2/2005 | Fjelstad | H01L 21/4832 338/276 |
| 7,105,913 | B2 * | 9/2006 | Dunn | H01L 23/49822 257/E23.062 |
| 11,000,215 | B1 * | 5/2021 | Simpson | A61B 5/157 |
| 2002/0026706 | A1 * | 3/2002 | Kurita | H01C 17/006 29/610.1 |
| 2005/0133872 | A1 * | 6/2005 | Dunn | H01L 23/49822 257/363 |
| 2006/0181389 | A1 * | 8/2006 | Cho | H01C 17/065 338/309 |
| 2006/0286742 | A1 * | 12/2006 | Chen | H01C 17/06526 438/238 |
| 2012/0000066 | A1 * | 1/2012 | Wei | H01C 7/003 29/610.1 |
| 2022/0223325 | A1 * | 7/2022 | Hsiao | H01C 17/288 |
| 2023/0207164 | A1 * | 6/2023 | Hsiao | H01C 17/242 204/192.21 |
| 2023/0280379 | A1 * | 9/2023 | Hsiao | H01C 17/00 438/602 |
| 2024/0013957 | A1 * | 1/2024 | Hsiao | H01C 1/148 |

FOREIGN PATENT DOCUMENTS

| | | | |
|---|---|---|---|
| CN | 116364366 A * | 6/2023 | |
| JP | 2004146859 A * | 5/2004 | H01C 1/14 |
| TW | 507219 B | 10/2002 | |
| TW | 201508780 A | 3/2015 | |
| TW | 201624505 A | 7/2016 | |
| TW | 201703057 A | 1/2017 | |
| TW | 202326763 A * | 7/2023 | B41M 3/006 |

* cited by examiner

METHOD FOR FABRICATING A MICRO RESISTANCE LAYER AND METHOD FOR FABRICATING A MICRO RESISTOR

RELATED APPLICATION

This application claims priority to Taiwan Application Serial Number 110149006, filed Dec. 28, 2021, which is herein incorporated by reference.

BACKGROUND

Technical Field

The present disclosure generally relates to a method for fabricating a micro resistance layer and method for fabricating a micro resistor.

Description of Related Art

With rapid development of economy and technologies, it is required for various electronic products such as smart phones, tablets and notebooks to provide more functions to meet user's demands. For example, the smart phones provide functions of image capturing and image processing to meet user's demands for image quality. Accordingly, it is required for the electronic products to use electric components having smaller sizes for integrating more electric components to meet user's demands.

Resistors are necessary components in the fabrication of the electronic products. In order to meet the demands for small product sizes, various resistors having small sizes such as 01005 type resistors and 0075 type resistors are developed for the demands for small sizes. However, a plenty of time and higher cost are required for typical fabrication method of the small size resistors. Therefore, a micro resistor fabrication method requiring lower fabrication cost and less fabrication time is needed.

SUMMARY

To solve the above mentioned problems, embodiments of the present disclosure provides a method for fabricating a micro resistance layer and a method for fabricating a micro resistor, which may greatly decrease fabrication time and fabrication cost of the micro resistor.

In accordance with an embodiment of the present disclosure, the method for fabricating a micro resistance layer includes: providing a substrate, in which a plurality of product regions are defined on the substrate, and an area of each of the product regions is small than or equal to $0.4*0.2$ mm$^2$; forming a first resistance layer on the substrate by using a screen printing process or a sputtering process, in which the first resistance layer covers the product regions; dividing the first resistance layer into a plurality of second resistance layers, in which each of the product regions encompasses one of the second resistance layers, and an area of each of the second resistance layers is small than $0.4*0.2$ mm$^2$; and trimming a pattern of each of the second resistance layers in accordance with a predetermined resistance value to enable the pattern of each one of the second resistance layers to correspond to the predetermined resistance value.

In some embodiments, the screen printing process is performed by using a fully-open screen.

In some embodiments, dividing the first resistance layer into the second resistance layers is performed by using a laser.

In some embodiments, trimming the pattern of each of the second resistance layers in accordance with a predetermined resistance value to enable the pattern of each one of the second resistance layers to correspond to the predetermined resistance value is performed by using a laser.

In accordance with an embodiment of the present disclosure, the method for fabricating a micro resistor includes: providing a substrate, in which the substrate has a first surface and a second surface opposite to the first surface, a plurality of resistor regions are defined on the substrate, and an area of each of the resistor regions is small than or equal to $0.4*0.2$ mm$^2$; forming a plurality of first inner electrode pairs on the first surface, in which each of the resistor regions encompasses one of the first inner electrode pairs; forming a plurality of second inner electrode pairs on the second surface, in which each of the resistor regions encompasses one of the second inner electrode pairs; forming a first resistance layer on the first surface of the substrate by using a screen printing process or a sputtering process to cover the resistor regions; dividing the first resistance layer into a plurality of second resistance layers, in which each of the resistor regions encompasses one of the second resistance layers, and each of the second resistance layers is smaller than $0.4*0.2$ mm$^2$; trimming a pattern of the second resistance layer of each of the resistor regions in accordance with a predetermined resistance value to enable the pattern of the second resistance layer of each of the resistor regions to correspond to the predetermined resistance value; dividing the substrate into a plurality of substrate strips in accordance with the resistor regions; forming an outer electrode layer on each of the substrate strips, in which the outer electrode layer comprises a side electrode layer, and is electrically connected to the first inner electrode pair, the second inner electrode pair and the second resistance layer of each of the resistor regions; and dividing each of the substrate strips in accordance with the resistor regions to obtain a plurality of micro resistors each having an area small than or equal to $0.4*0.2$ mm$^2$.

In some embodiments, dividing the first resistance layer into the second resistance layers is performed by using a laser.

In some embodiments, trimming the pattern of the second resistance layer of each of the resistor regions in accordance with the predetermined resistance value is performed by using a laser.

In some embodiments, the screen printing process is performed by using a fully-open screen.

In some embodiments, the resistor regions are arranged in a matrix having a plurality of resistor columns and a plurality of resistor rows.

In some embodiments, the fully-open screen comprises a plurality of openings, and an area of each of the openings is determined in accordance with an area of each of the resistor columns of the matrix.

In accordance with an embodiment of the present disclosure, the method for fabricating a micro resistor includes: providing a substrate, in which the substrate has a first surface and a second surface opposite to the first surface, a plurality of resistor regions are defined on the substrate, and an area of each of the resistor regions is small than or equal to $0.4*0.2$ mm$^2$; forming a plurality of first inner electrode pairs on the first surface, in which each of the resistor regions encompasses one of the first inner electrode pairs; forming a plurality of second inner electrode pairs on the second surface, in which each of the resistor regions encompasses one of the second inner electrode pairs; forming a first resistance layer on the first surface of the substrate by using a screen printing process or a sputtering process to cover the resistor regions; dividing the first resistance layer into a plurality of second resistance layers, in which each of the resistor regions encompasses one of the second resistance layers, and each of the second resistance layers is smaller than $0.4*0.2$ mm$^2$; trimming a pattern of the second resistance layer of each of the resistor regions in accordance with a predetermined resistance value to enable the pattern of the second resistance layer of each of the resistor regions to correspond to the predetermined resistance value; performing an outer electrode forming step to form an outer electrode layer in each of the resistor regions, in which the outer electrode layer comprises a side electrode layer, and is electrically connected to the first inner electrode pair, the second inner electrode pair and the second resistance layer of each of the resistor regions; and dividing the substrate in accordance with the resistor regions to obtain a plurality of micro resistors each having an area small than or equal to $0.4*0.2$ mm$^2$.

In some embodiments, dividing the first resistance layer into the second resistance layers is performed by using a laser.

In some embodiments, trimming the pattern of the second resistance layer of each of the resistor regions in accordance with the predetermined resistance value is performed by using a laser.

In some embodiments, the resistor regions are arranged in a matrix having a plurality of resistor columns and a plurality of resistor rows.

In some embodiments, the screen printing process is performed by using a fully-open screen.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

The using of "first", "second", "third", etc. in the specification should be understood for identifying units or data described by the same terminology, but are not referred to particular order or sequence.

Figure 1:
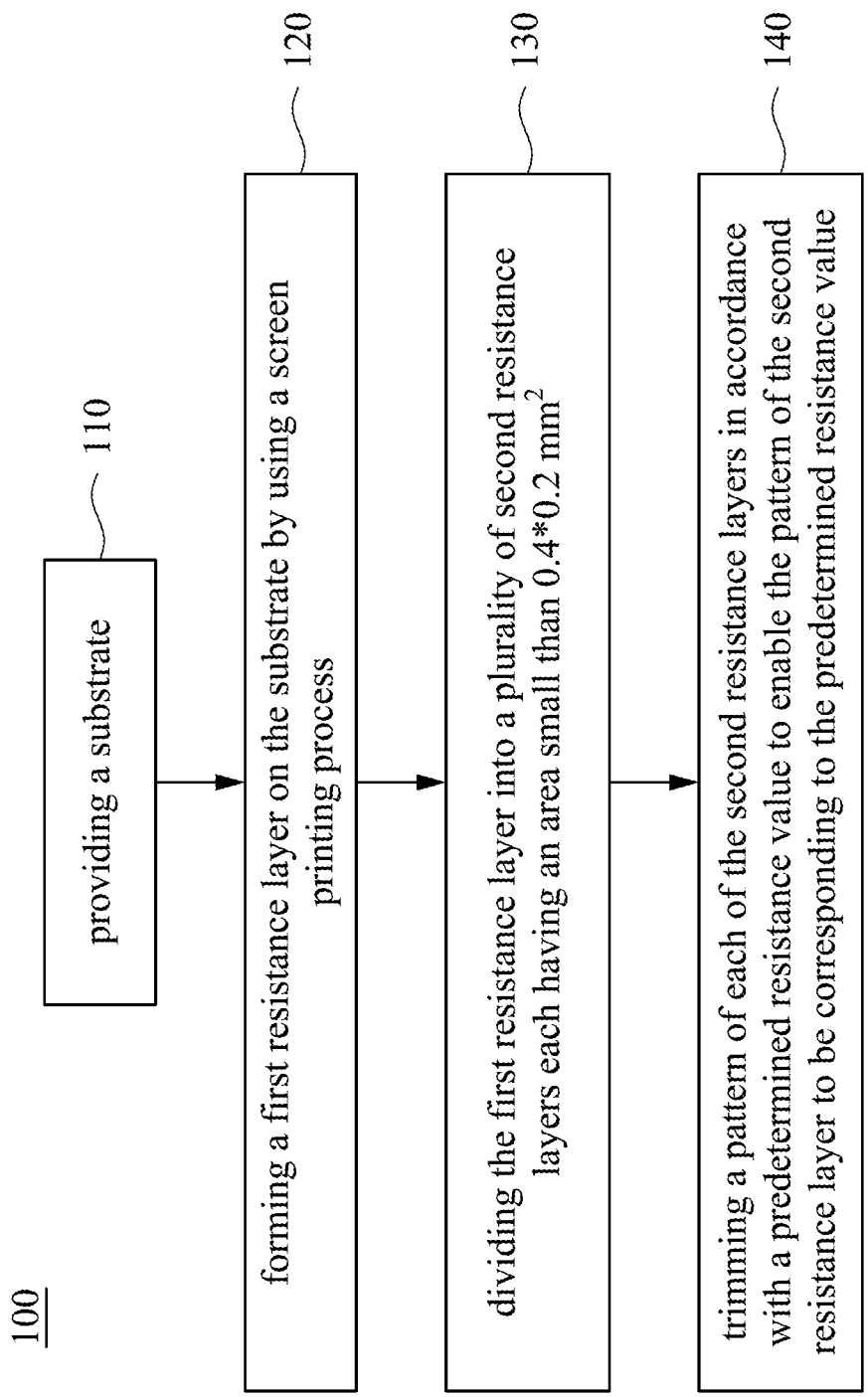
FIG. 1 is a schematic diagram showing a flow chart of a method for fabricating a micro resistance layer in accordance with an embodiment of the present disclosure.
Figure 2A:
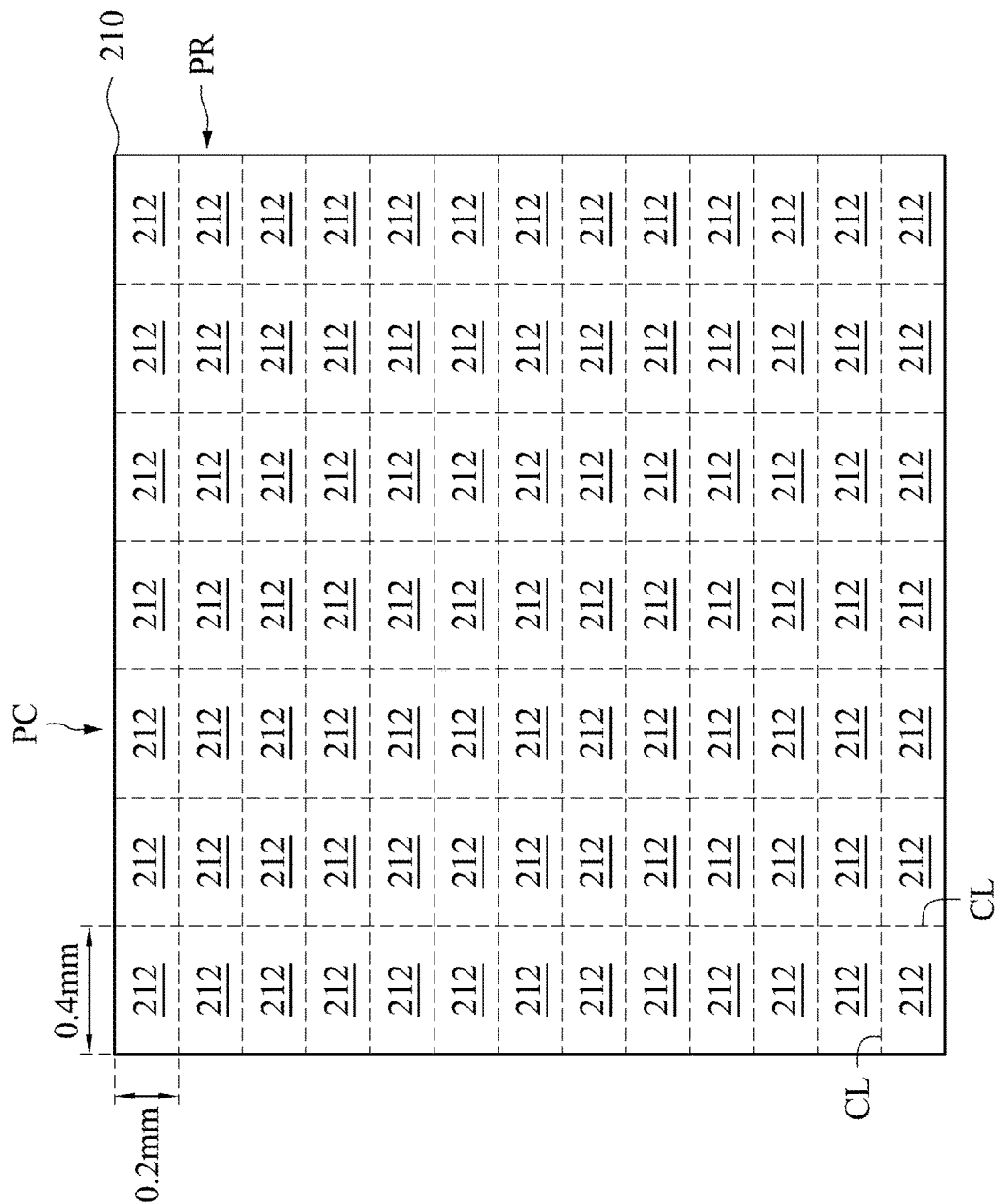
FIG. 2A is a schematic diagram showing a substrate in accordance with an embodiment of the present invention.

Referring to FIG. 1, FIG. 1 is a schematic diagram showing a flow chart of a method 100 for fabricating a micro resistance layer in accordance with an embodiment of the present disclosure. The micro resistance layer fabrication method 100 is adapted for fabrication of a micro resistance layer having an area small than or equal to $0.4*0.2$ mm². In the micro resistance layer fabrication method 100, at first, step 110 is performed to provide a substrate 210, as shown in FIG. 2A. The substrate 210 can be formed by using insulation material, for example glass fibers, Aluminum Nitride material, Silicon-based material or Ceramic material, but embodiments of the present disclosure are not limited thereto. A plurality of product regions 212 are defined on the substrate 210 through a plurality of virtual cutting lines CL. The product region 212 is pre-defined for a product having a resistance layer, for example a resistor or other component having a resistance layer. In this embodiment, the product region 212 has an area small than or equal to $0.4*0.2$ mm², and the resistor regions 212 are arranged in a matrix having a plurality of product columns PC and a plurality of product rows PR. In some embodiments, the product region 212 has an area substantially equal to $0.3*0.15$ mm².

Figure 2B:
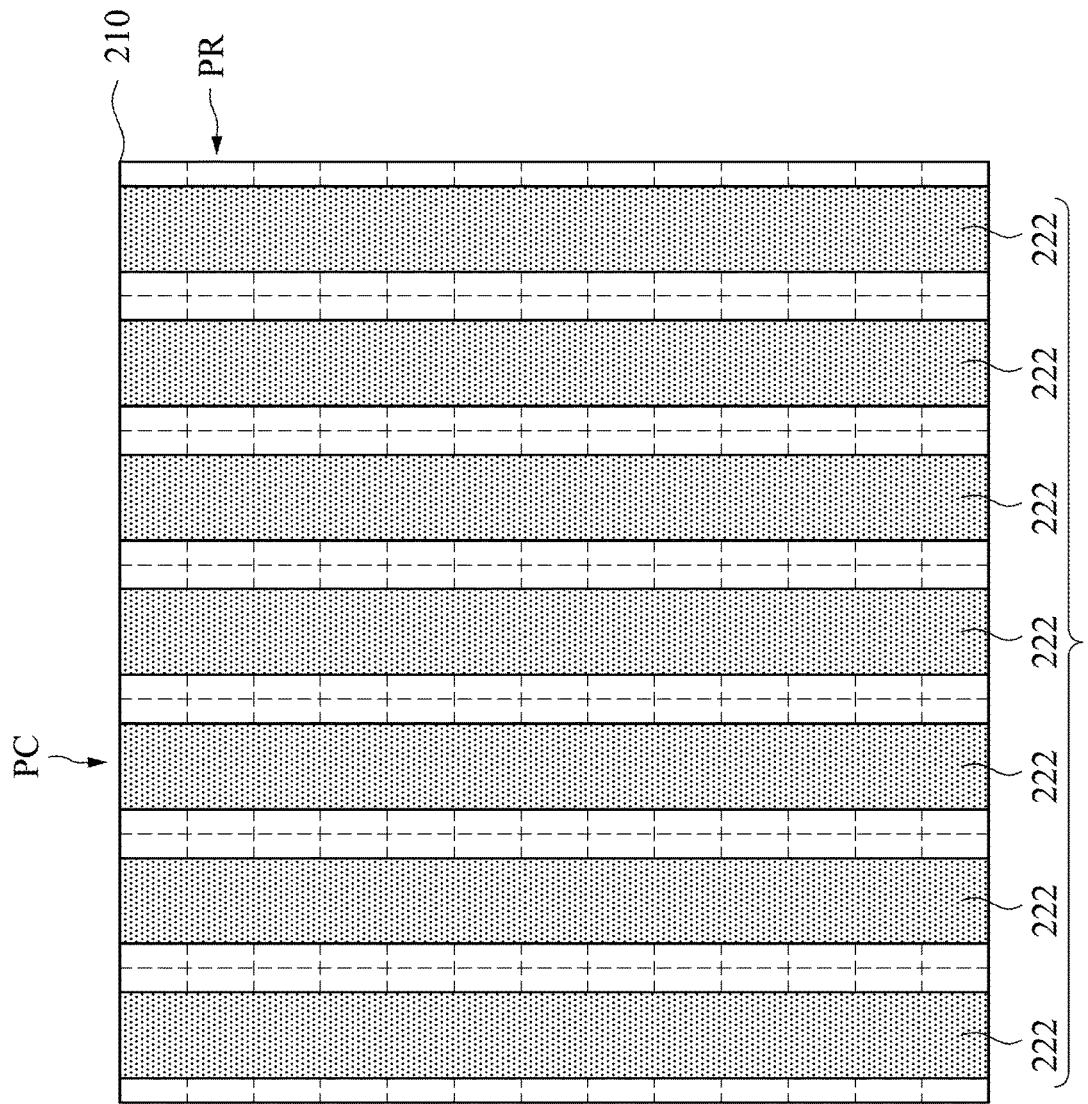
FIG. 2B is a schematic diagram showing a first resistance layer in accordance with an embodiment of the present disclosure.

Then, step 120 is performed to use a screen printing process to form a first resistance layer 220 on the substrate 210, as shown in FIG. 2B. In this embodiment, the screen printing process of the step 120 uses a fully-open screen to form the first resistance layer 220 on the first resistance layer 220. The first resistance layer 220 includes a plurality of sub resistance layers 222 formed on the product columns PC accordingly. For example, in this embodiment, the sub resistance layers 222 are formed corresponding to the product columns PC and formed across the product rows PR. However, embodiments of the present disclosure are not limited thereto.

Figure 2C:
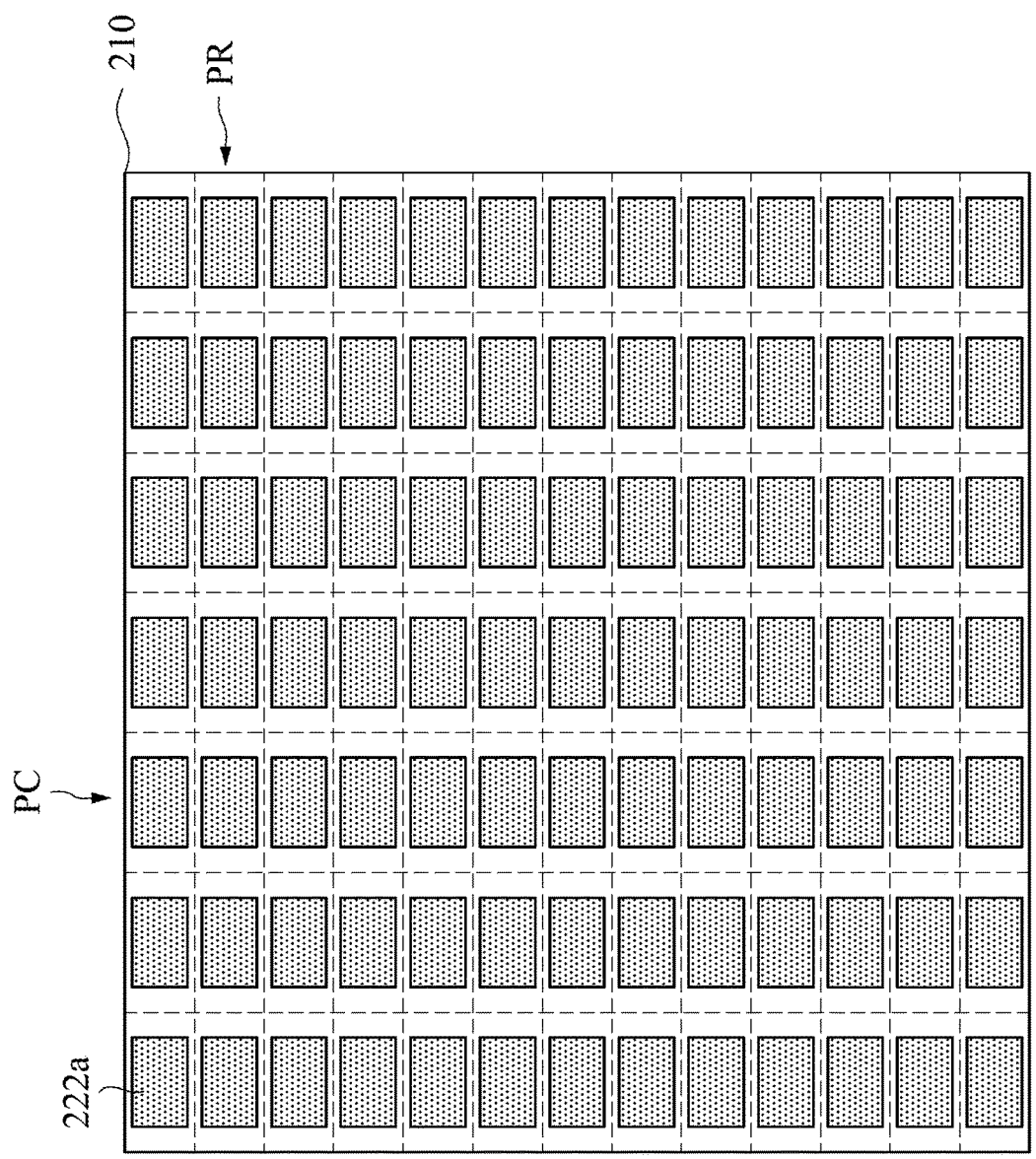
FIG. 2C is a schematic diagram showing second resistance layers in accordance with an embodiment of the present disclosure.
Figure 2D:
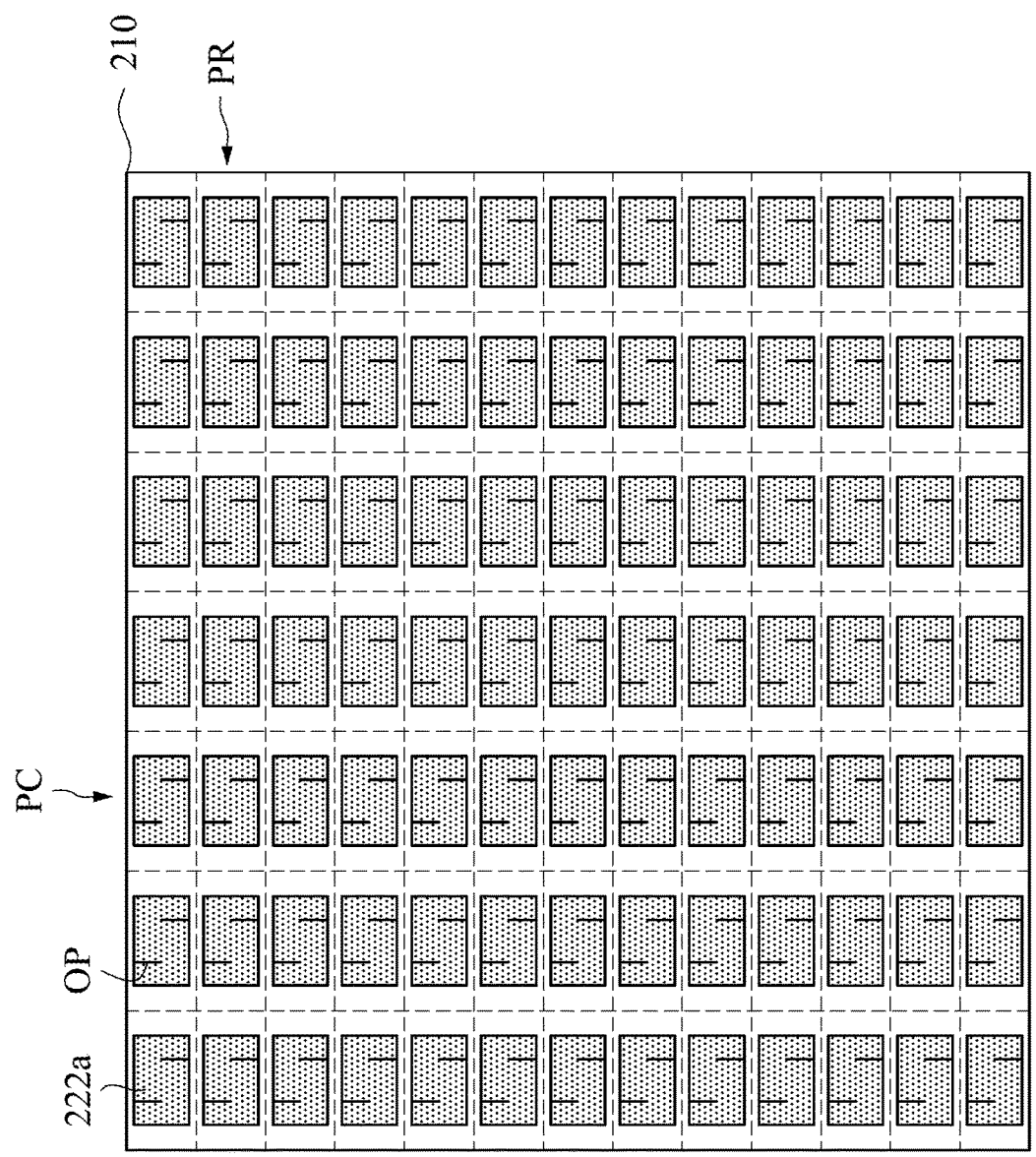
FIG. 2D is a schematic diagram showing pattern trimming of the second resistance layers in accordance with an embodiment of the present disclosure.

Thereafter, step 130 and step 140 are performed to divide the first resistance layer 220 into a plurality of second resistance layer 222a in accordance with the product regions 212, and to trim the second resistance layer 222a. In step 130, each of the sub resistance layers 222 of the first resistance layer 220 is divided into the second resistance layers 222a as shown in FIG. 2C. For example, each of the sub resistance layers 222 is divided into the second resistance layers 222a in accordance with the product rows PR to enable each of the product regions 212 to encompass one second resistance layer 222a. In this embodiment, because the product region 212 has an area small than or equal to $0.4*0.2$ mm², an area of the second resistance layer 222a of each of the product regions 212 is small than $0.4*0.2$ mm². In step 140, a pattern of the second resistance layer 222a of each of the product regions 212 is trimmed in accordance with a predetermined resistance value (for example, forming a long opening OP by cutting the second resistance layer 222a) to enable the pattern of the second resistance layer 222a to be corresponding to the predetermined resistance value as shown in FIG. 2D. In this embodiment, the operations of dividing the first resistance layer 220 and trimming the pattern of the second resistance layer 222a are performed by using a laser, but embodiments of the present disclosure are not limited thereto.

Figure 3A:
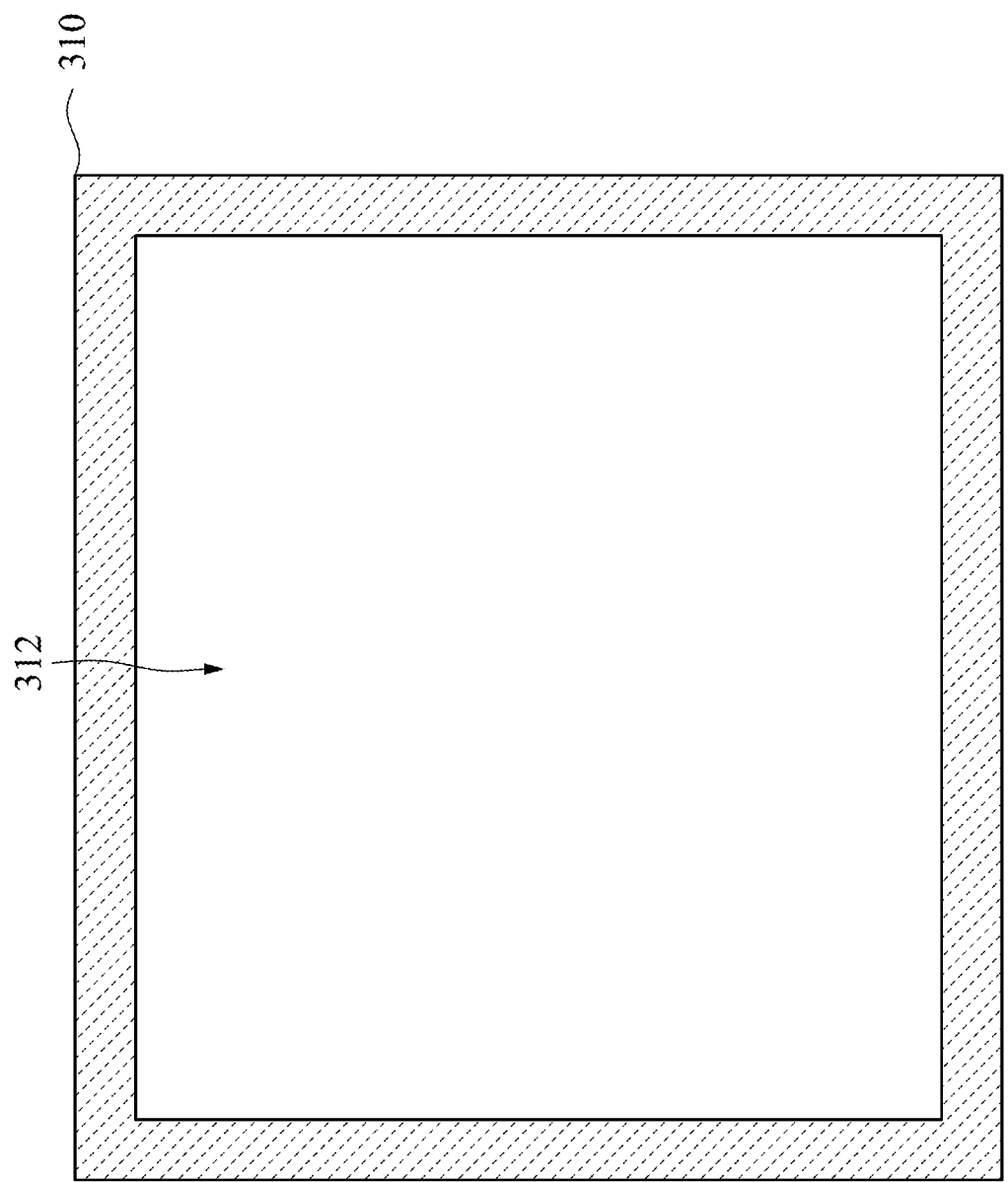
FIG. 3A is a schematic diagram showing a fully-open screen in accordance with an embodiment of the present disclosure.

In addition, in some embodiments, the above step 120 may include a mask forming step to form a mask (not shown) on the substrate 210 in advance. The mask has a plurality of openings to expose portions of the substrate 210. Then, a fully-open screen 310 is used to form the first resistance layer 220 on the mask and covering the substrate 210, in which the fully-open screen 310 does not have any mesh and knot, and an opening 312 of the fully-open screen 310 has a size substantially equal to the size of the matrix of the product regions 212, as shown in FIG. 3A. Therefore, the first resistance layer 220 covering the matrix of the product regions 212 can be formed, in which portions of the first resistance layer 220 are formed on the exposed portions of the substrate 210. Then, the mask and the first resistance layer 220 formed on the mask are removed to obtain the first resistance layer 220 as shown in FIG. 2B.

Figure 3B:
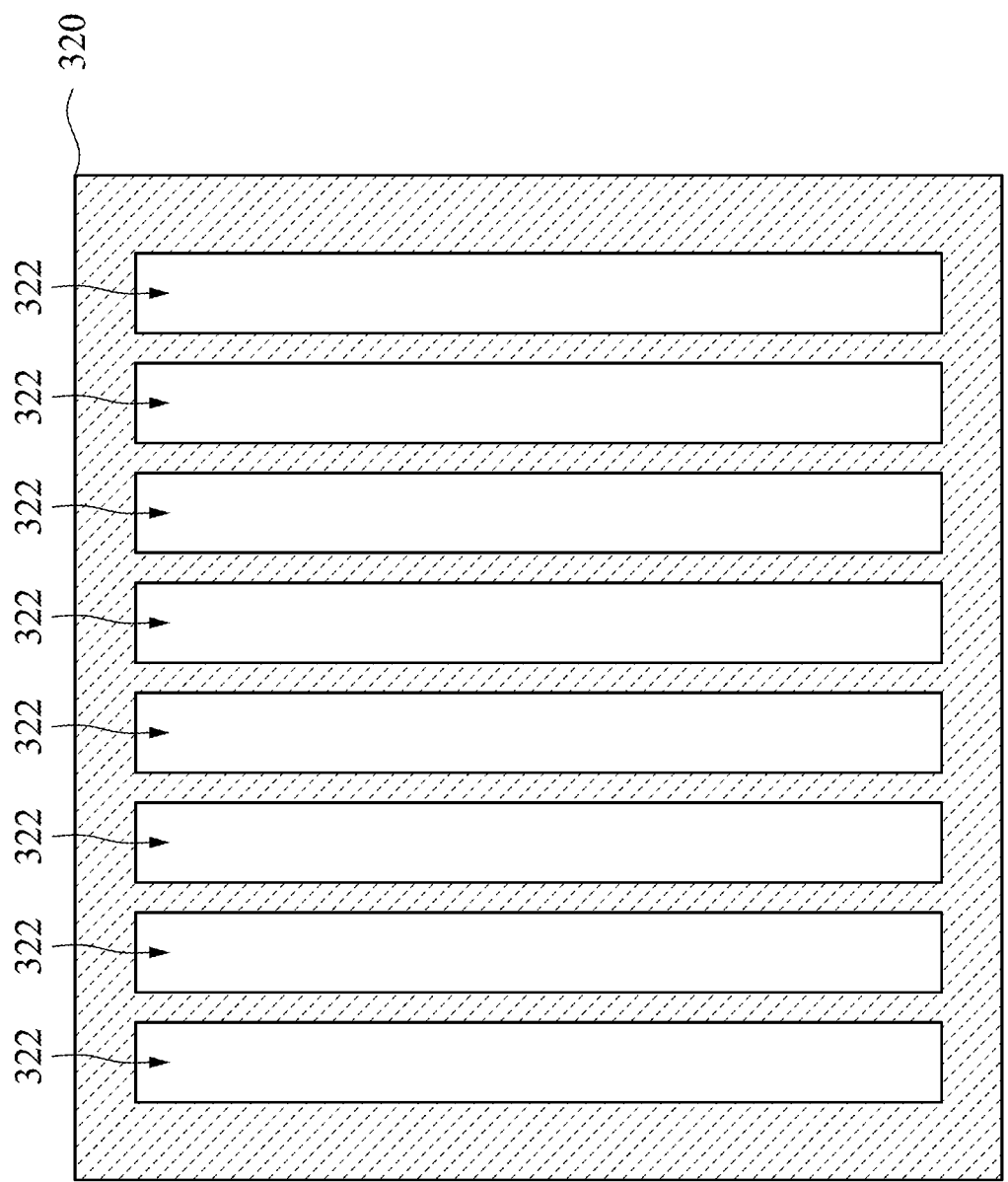
FIG. 3B is a schematic diagram showing a fully-open screen in accordance with an embodiment of the present disclosure.

In some embodiments, another fully-open screen 320 is used in the above step 120 as shown in FIG. 3B, in which the fully-open screen 320 does not have any mesh and knot, and has a plurality of openings 322. To form the first resistance layer 220 as shown in FIG. 2B, an area of each of the openings 322 is determined in accordance with the product column PC. For example, a length of the opening 322 is substantially equal to a length of the product column PC, and a width of the opening 322 is slightly smaller than a width of the product column PC.

In accordance with the above descriptions, in the micro resistance layer fabrication method 100 of the embodiment of the present disclosure, the screen printing process is used to form a micro resistance layer having a small size, in which the screen printing process uses the fully-open screen to form the micro resistance layer. Because the micro resistance layer fabrication method 100 uses the fully-open screen to form the micro resistance layer, disadvantages, for example deletion of a shape of the printed layer, insufficiency of a thickness of the printed layer or undesired holes on the printed layer caused by the mesh and knot of the screen are avoid. Further, using the screen printing process to fabricate the micro resistance layer can greatly decrease the fabrication cost and fabrication time of the micro resistance layer.

Figure 4:
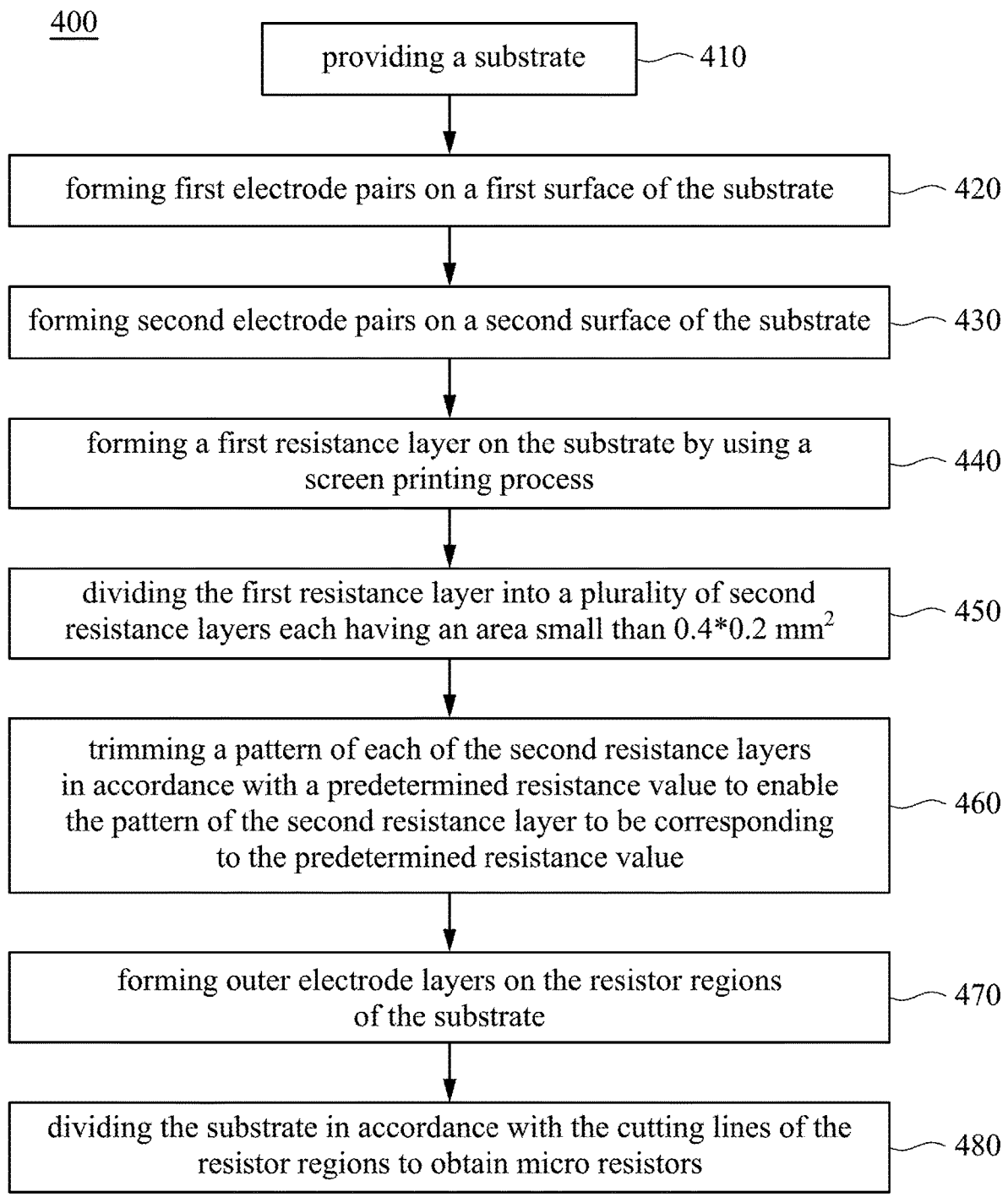
FIG. 4 is a schematic diagram showing a flow chart of a method for fabricating a micro resistor in accordance with an embodiment of the present disclosure.
Figure 5A:
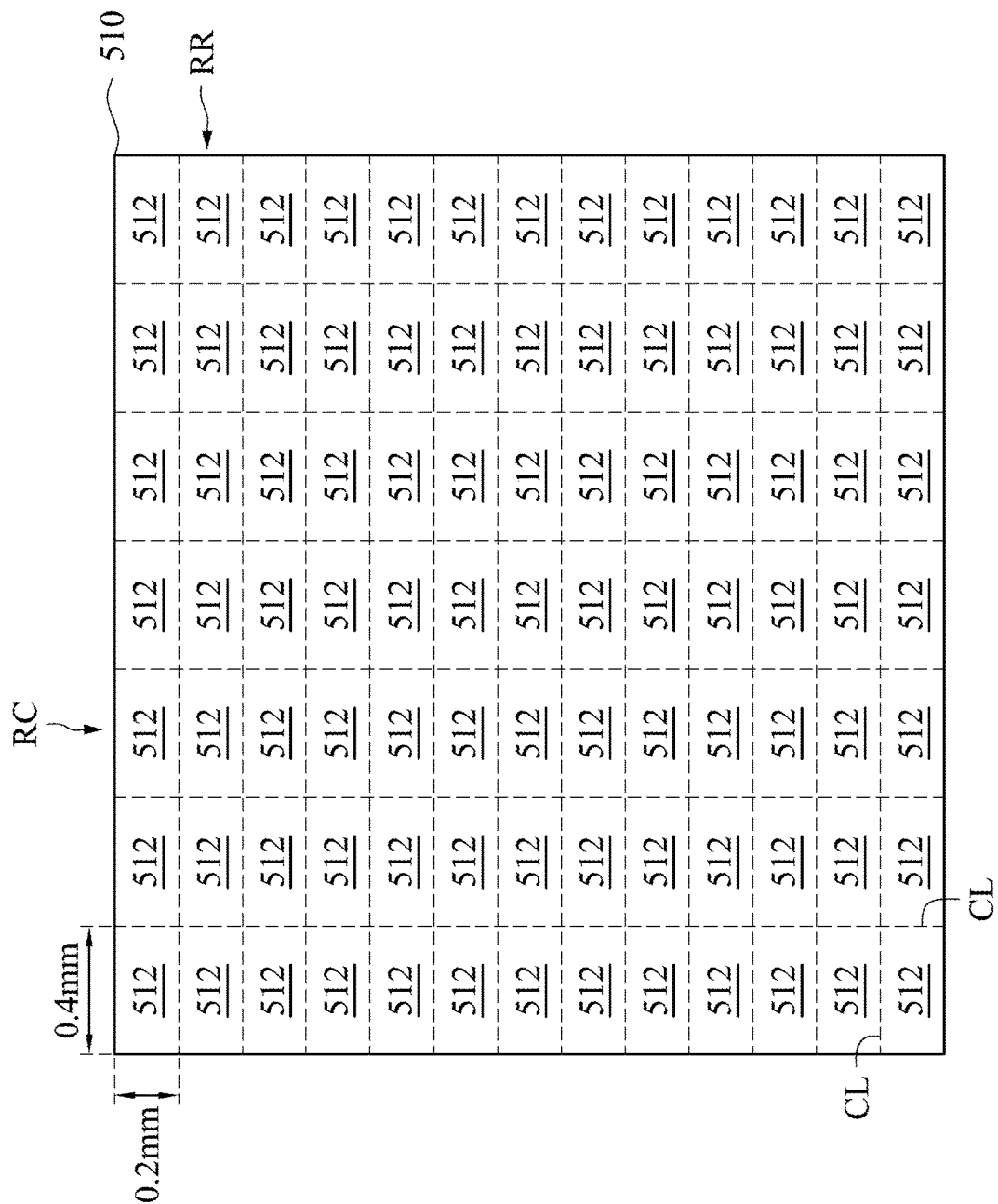
FIG. 5A is a schematic diagram showing a substrate in accordance with an embodiment of the present disclosure.

Referring to FIG. 4, FIG. 4 is a schematic diagram showing a flow chart of a method 400 for fabricating a micro resistor in accordance with an embodiment of the present disclosure. The micro resistor fabrication method 400 uses the above micro resistance layer fabrication method 100 to fabricate a micro resistor such as a 01005 type resistor, a 0075 type resistor or a micro resistor having a smaller size. In the micro resistor fabrication method 400, at first, step 410 is performed to provide a substrate 510, as shown in FIG. 5A. The substrate 510 can be formed by using insulation material, for example glass fibers, Aluminum Nitride material, Silicon-based material or Ceramic material, but embodiments of the present disclosure are not limited thereto. A plurality of resistor regions 512 are defined on the substrate 510 through a plurality of virtual cutting lines CL. The resistor region 512 is pre-defined for a resistor. In this embodiment, the resistor region 512 has an area small than or equal to $0.4*0.2$ mm², and the resistor regions 512 are arranged in a matrix having a plurality of resistor columns RC and a plurality of resistor rows RR. In some embodiments, the resistor region 512 has an area substantially equal to $0.3*0.15$ mm².

Figure 5B:
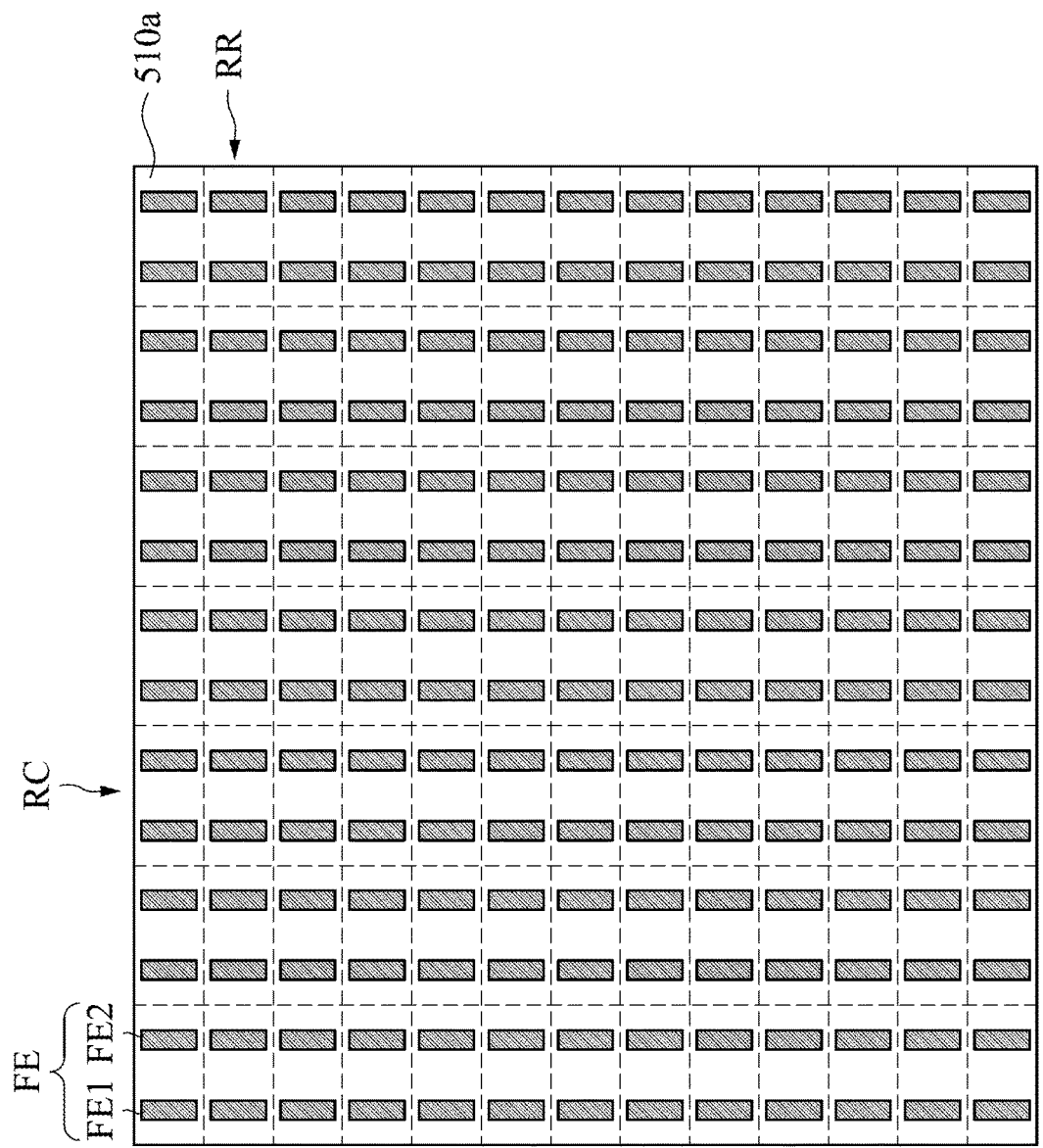
FIG. 5B is a schematic diagram showing first electrode pairs in accordance with an embodiment of the present disclosure.
Figure 5C:
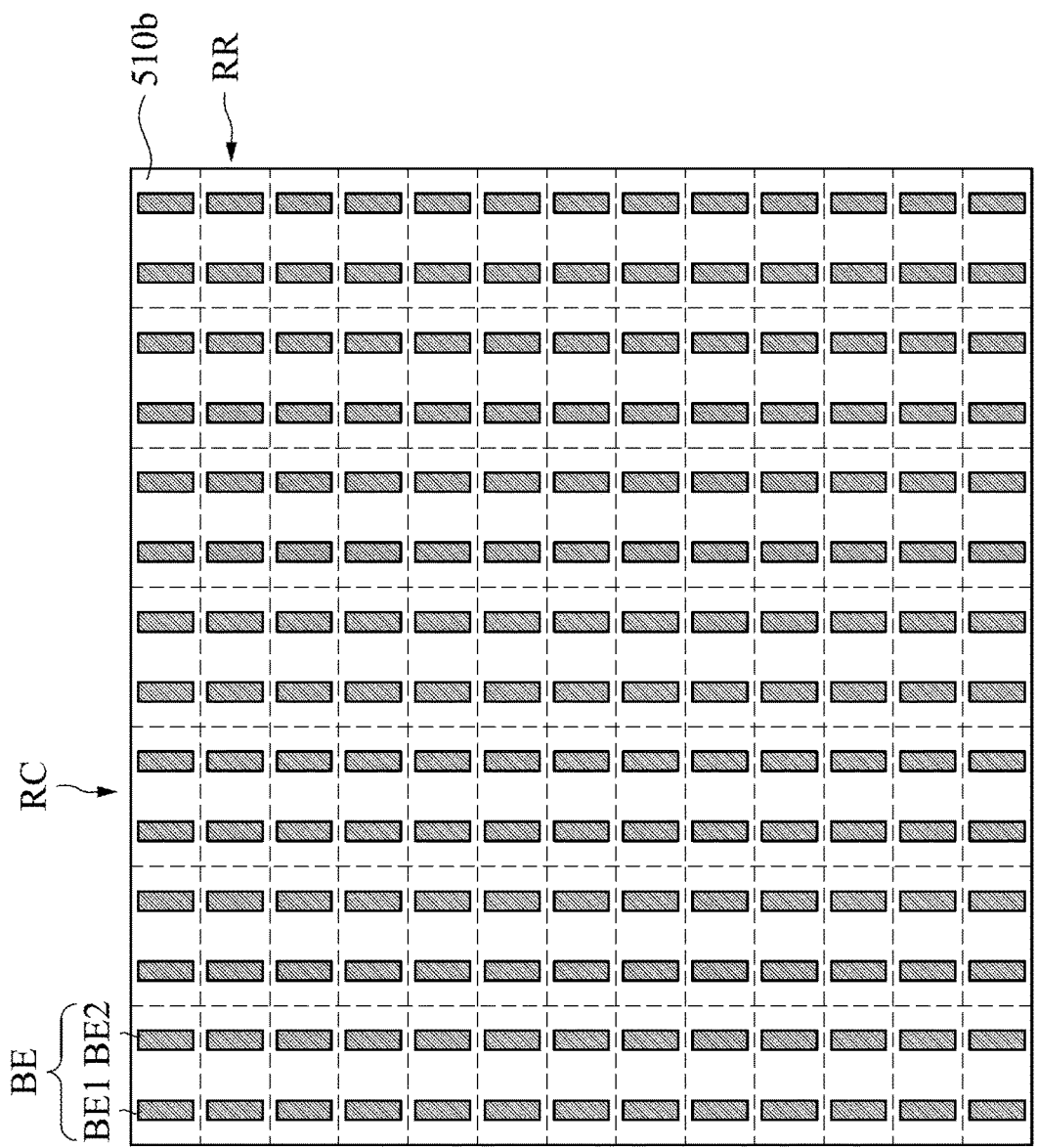
FIG. 5C is a schematic diagram showing second electrode pairs in accordance with an embodiment of the present disclosure.

Then, step 420 and step 430 are performed to form a plurality of first electrode pairs FE and second electrode pairs BE respectively on a first surface 510a and a second surface 510b of the substrate 510, as shown in FIG. 5B and FIG. 5C. In this embodiment, the first surface 510a is a front side of the substrate 510, and the second surface 510b is a back side of the substrate 510. The front side of each of the resistor regions 512 encompasses one first electrode pairs FE, and each of the first electrode pairs FE includes two electrodes FE1 and FE 2. The back side of each of the resistor regions 512 encompasses one second electrode pairs BE, and each of the second electrode pairs BE includes two electrodes BE1 and BE 2.

Figure 5D:
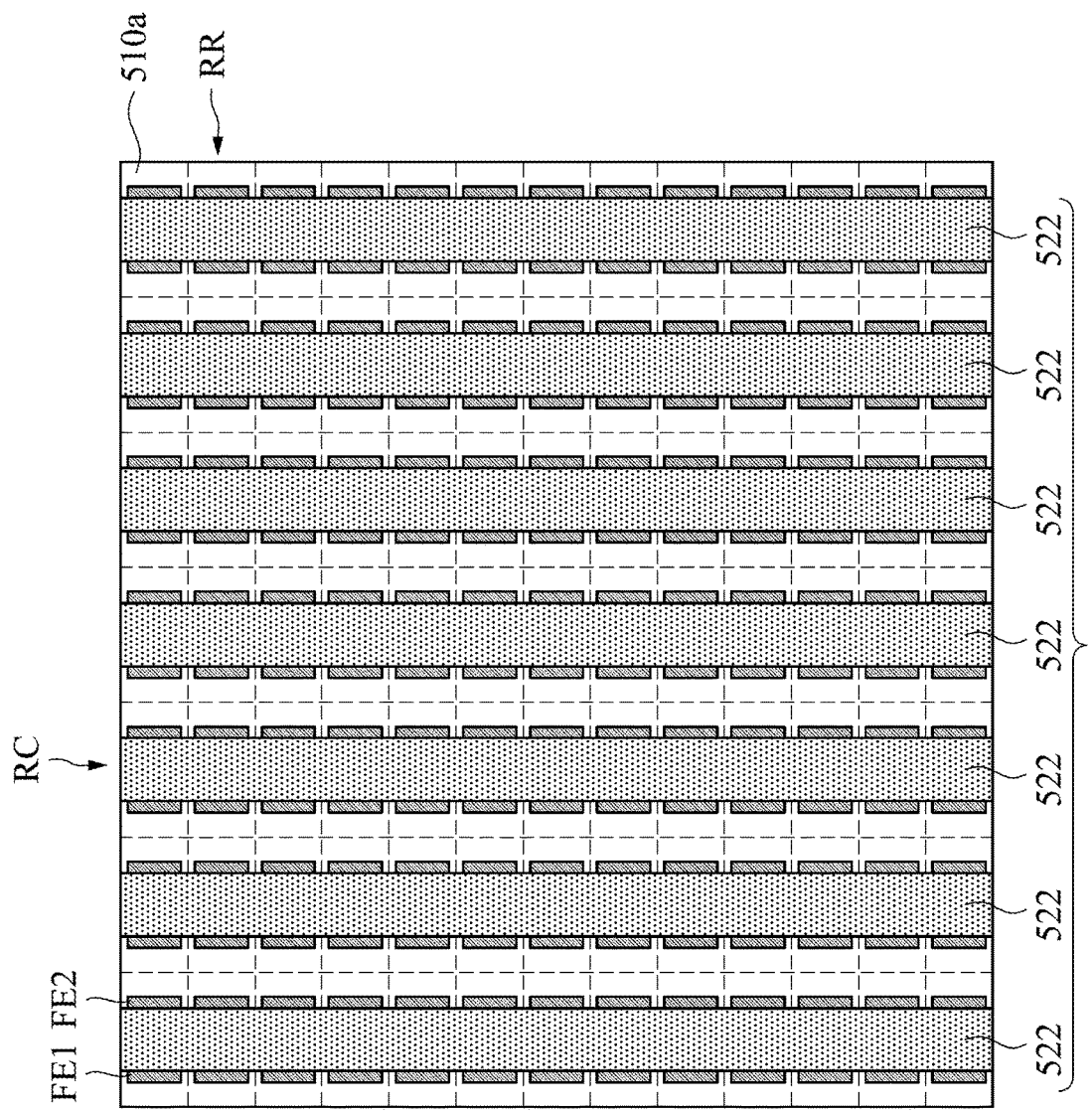
FIG. 5D is a schematic diagram showing a first resistance layer in accordance with an embodiment of the present disclosure.

Then, a step 440 is performed to use a screen printing process to form a first resistance layer 520 on the first surface 510a of the substrate 510, as shown in FIG. 5D. In this embodiment, the screen printing process of the step 440 uses the fully-open screen to form a first resistance layer 520 on the first surface 510a of the substrate 510. The first resistance layer 520 includes a plurality of sub resistance layers 522 formed on the resistor columns RC accordingly. For example, in this embodiment, the sub resistance layers 522 are formed corresponding to the resistor columns RC and formed across the resistor rows RR. However, embodiments of the present disclosure are not limited thereto.

In some embodiments of the present disclosure, a sequence of steps 410-430 can be adjusted in accordance with user's demands. For example, the first resistance layer 520 can be formed at first, and then the first electrode pairs FE are formed.

Figure 5E:
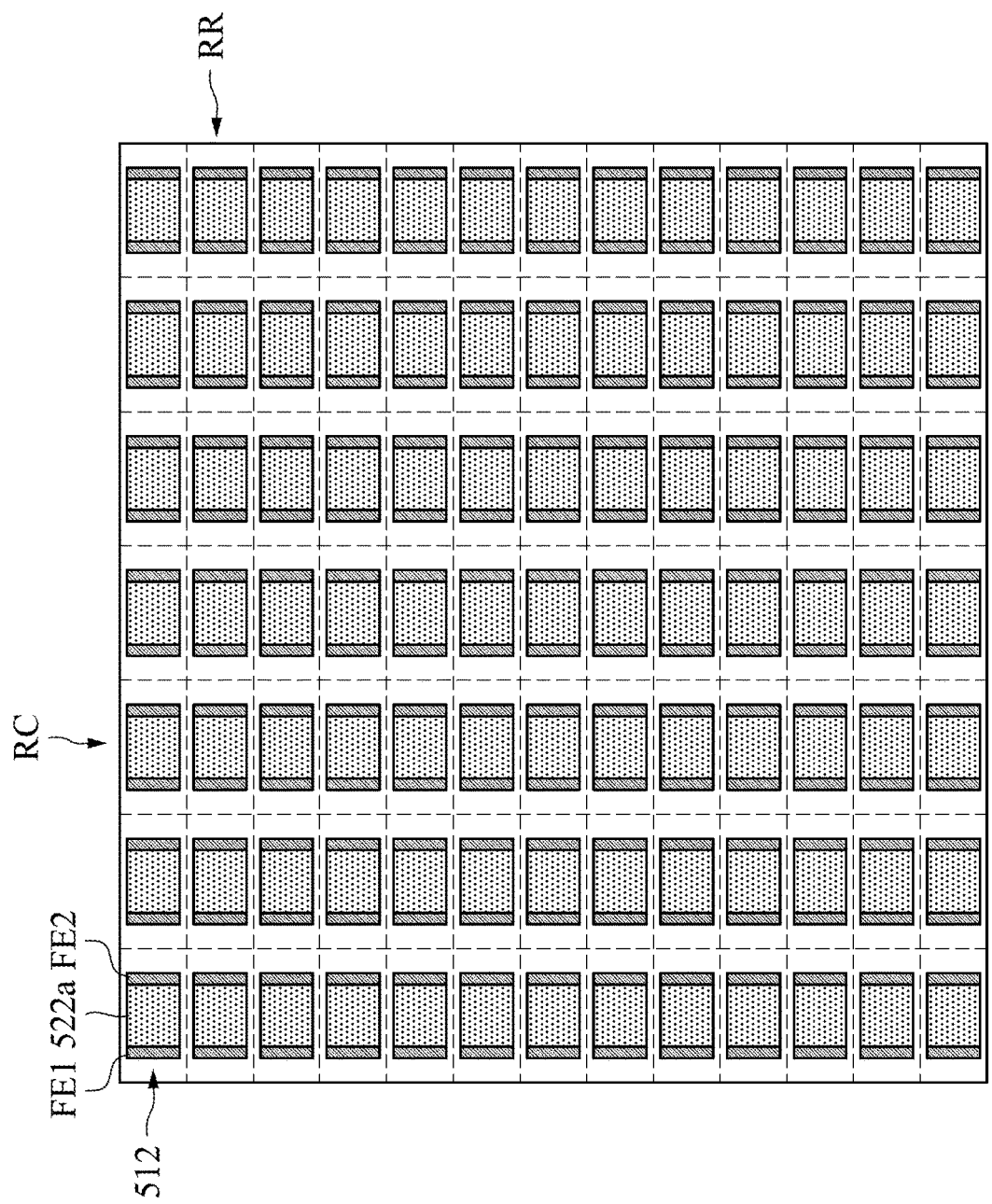
FIG. 5E is a schematic diagram showing second resistance layers in accordance with an embodiment of the present disclosure.
Figure 5F:
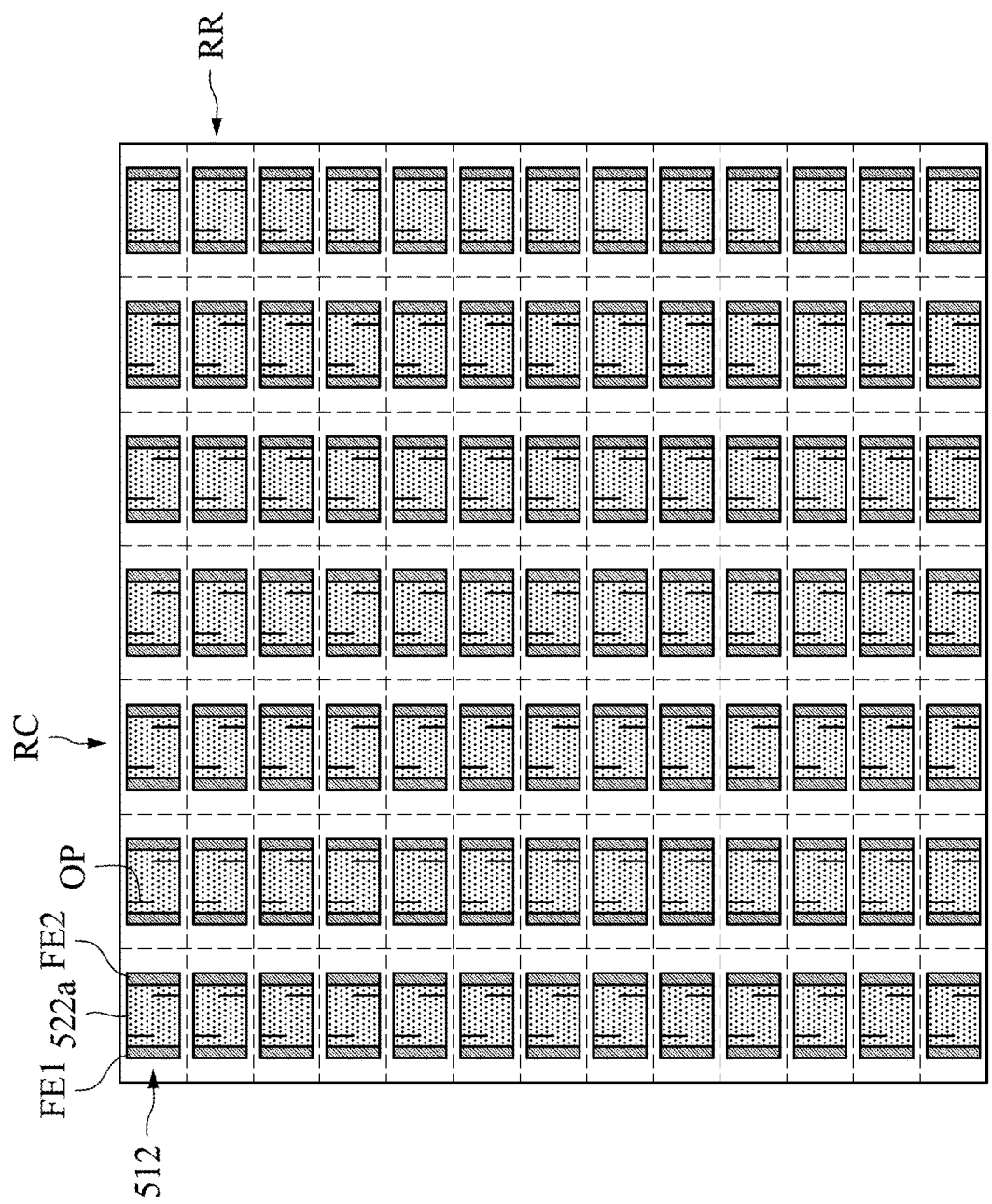
FIG. 5F is a schematic diagram showing pattern trimming of the second resistance layers in accordance with an embodiment of the present disclosure.

Thereafter, step 450 and step 460 are performed to divide the first resistance layer 520 into a plurality of second resistance layer 522a in accordance with the resistor regions 512, and to trim the second resistance layer 522a. In step 450, each of the sub resistance layers 522 of the first resistance layer 520 is divided into the second resistance layers 522a as shown in FIG. 5E. For example, each of the sub resistance layers 522 is divided into the second resistance layers 522a in accordance with the resistor rows RR to enable each of the resistor regions 512 to encompass one second resistance layer 522a. In this embodiment, because the resistor region 512 has an area small than or equal to $0.4*0.2$ mm$^2$, an area of the second resistance layer 522a of each of the resistor regions 512 is small than $0.4*0.2$ mm$^2$. In step 460, a pattern of the second resistance layer 522a of each of the resistor regions 512 is trimmed in accordance with a predetermined resistance value to enable the pattern of the second resistance layer 522a to be corresponding to the predetermined resistance value as shown in FIG. 5F. In this embodiment, the operations of dividing the first resistance layer 520 and trimming the pattern of the second resistance layer 522a are performed by using a laser, but embodiments of the present disclosure are not limited thereto.

It can be understood that the micro resistance layer fabrication method 100 is used in steps 410-460, and thus the micro resistor fabrication method 400 can form a micro resistance pattern on each of the resistor regions 512.

Figure 5G:
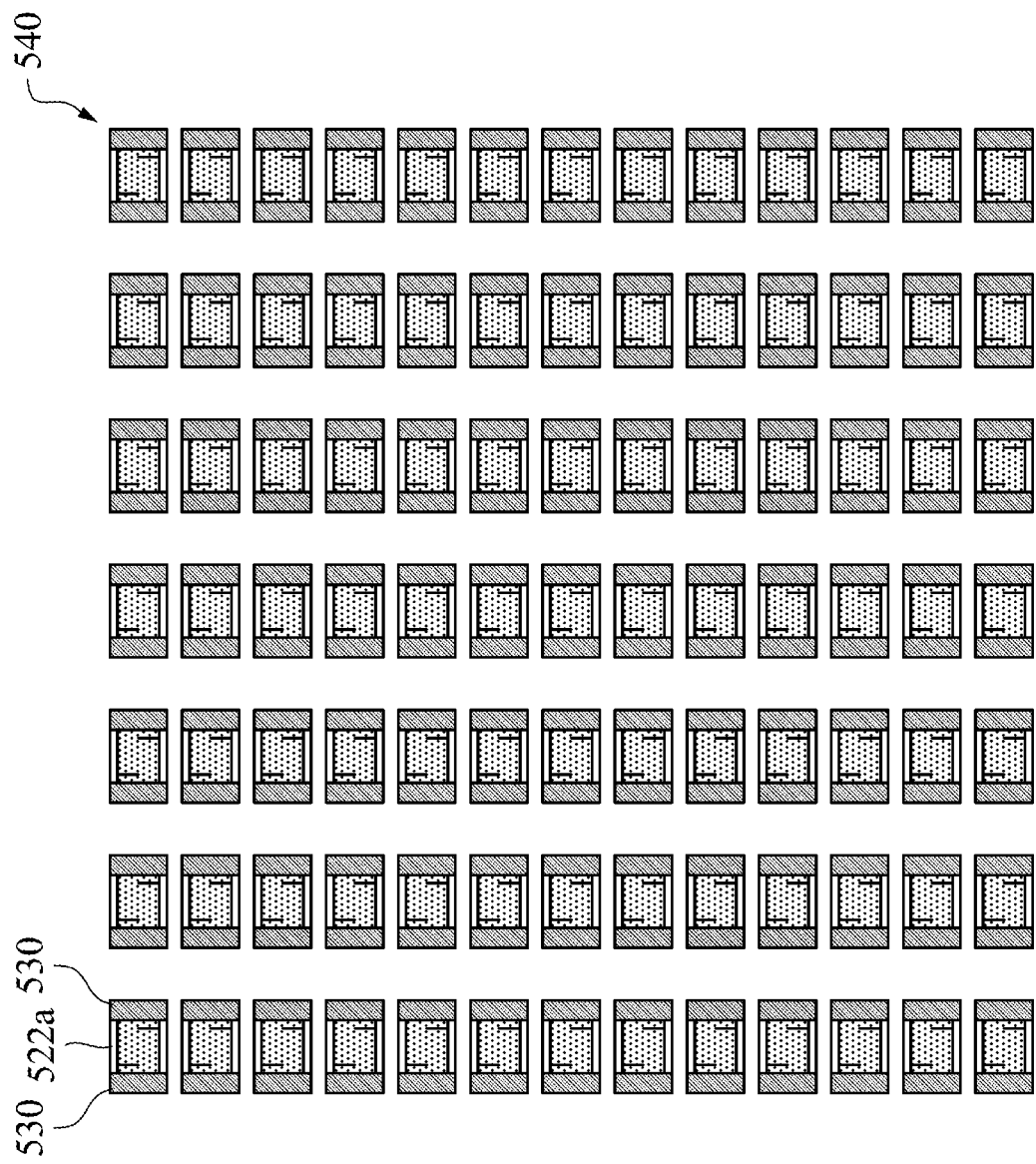
FIG. 5G is a schematic diagram showing micro resistors having second resistance layers in accordance with an embodiment of the present disclosure.

Thereafter, step 470 and step 480 are performed to form outer electrode layers 530 on each of the resistor regions 512, and to divide the resistor regions 512 into a plurality of micro resistors 540 each having an area smaller than $0.4*0.2$ mm$^2$, as shown in FIG. 5G. In FIG. 5G, the outer electrode layers 530 cover two terminals of the micro resistor 540, and are electrically connected to the first electrode pair FE, the second electrode pair BE and the second resistance layer 522a. For example, the outer electrode layers 530 include side electrode layers, and the side electrode layers extend to the backside of the micro resistor 540 along two terminal sidewalls of the micro resistor 540, to achieve the electric connection between the first electrode pair FE and the second electrode BE.

In some embodiments, the step 470 is performed to divide the substrate 510 into a plurality of substrate strips in accordance with the resistor columns RC, and then to form outer electrode layers 530 on the substrate strips. Then, the step 480 is performed to divide the substrate strips into the micro resistors 540 in accordance with the resistor rows RR.

In some embodiments, the step 470 is performed to form the outer electrode layers 530 in each of the resistor regions 512, in which the substrate 510 is not divided. Then, the step 480 is performed to divide the substrate 510 into the micro resistors 540 in accordance with the resistor rows RR.

In accordance with the above descriptions, the micro resistor fabrication method 400 uses the micro resistance layer fabrication method 100, the pattern of the resistance layer of the micro resistor 540 fabricated by using the micro resistor fabrication method 400 has less deletion, and the fabrication cost and fabrication time of the micro resistor 540 can be greatly decreased.

In some embodiments of the present disclosure, the micro resistance layer/micro resistor fabrication method 100/400 can be performed by using a sputtering process instead of using the screen printing process. Therefore, a micro resistance layer/micro resistor having a smaller resistance value (<1Ω) can be obtained.

Figure 6:
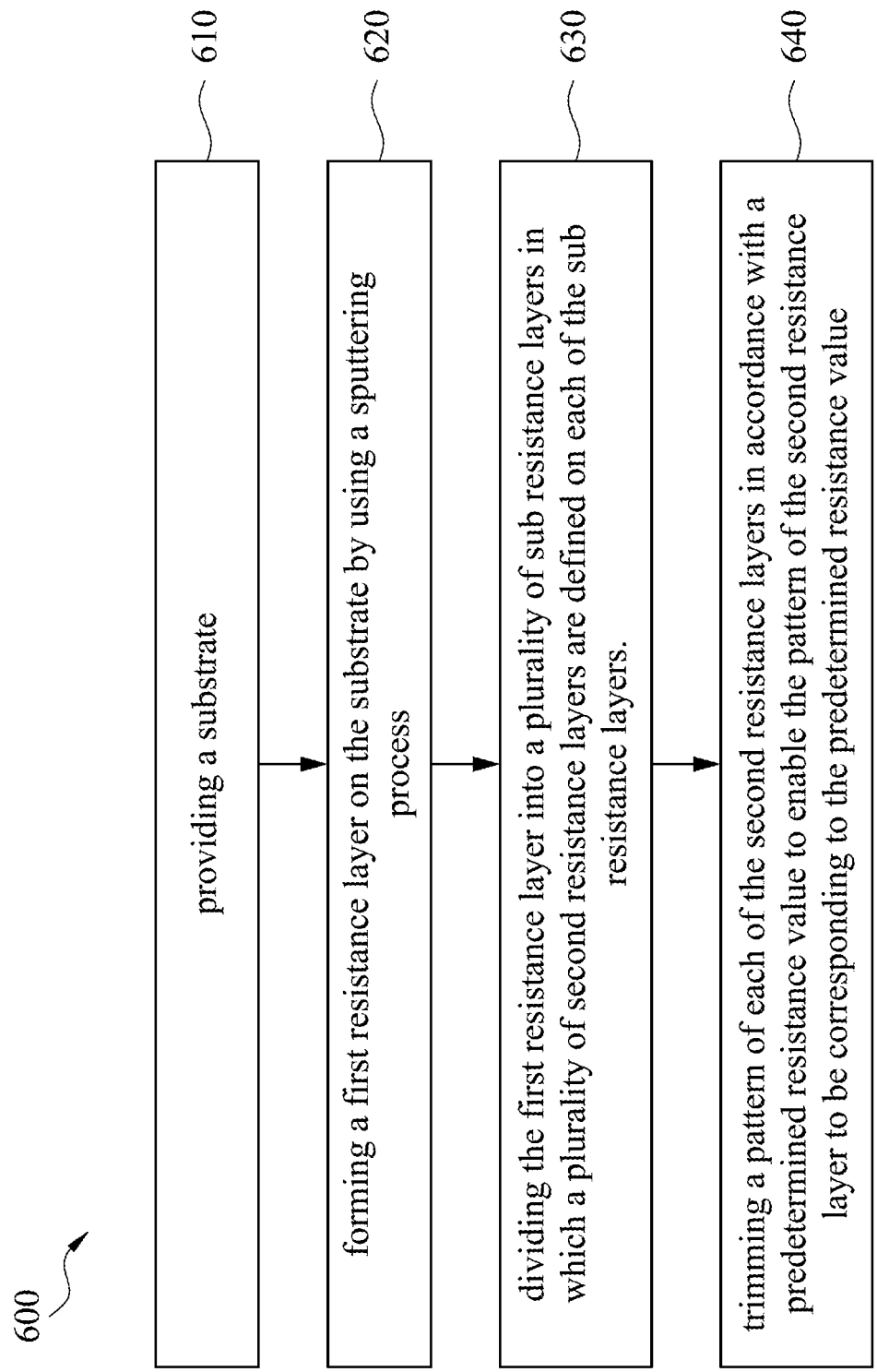
FIG. 6 is a schematic diagram showing a flow chart of a method for fabricating a micro resistor in accordance with an embodiment of the present disclosure.
Figure 7A:
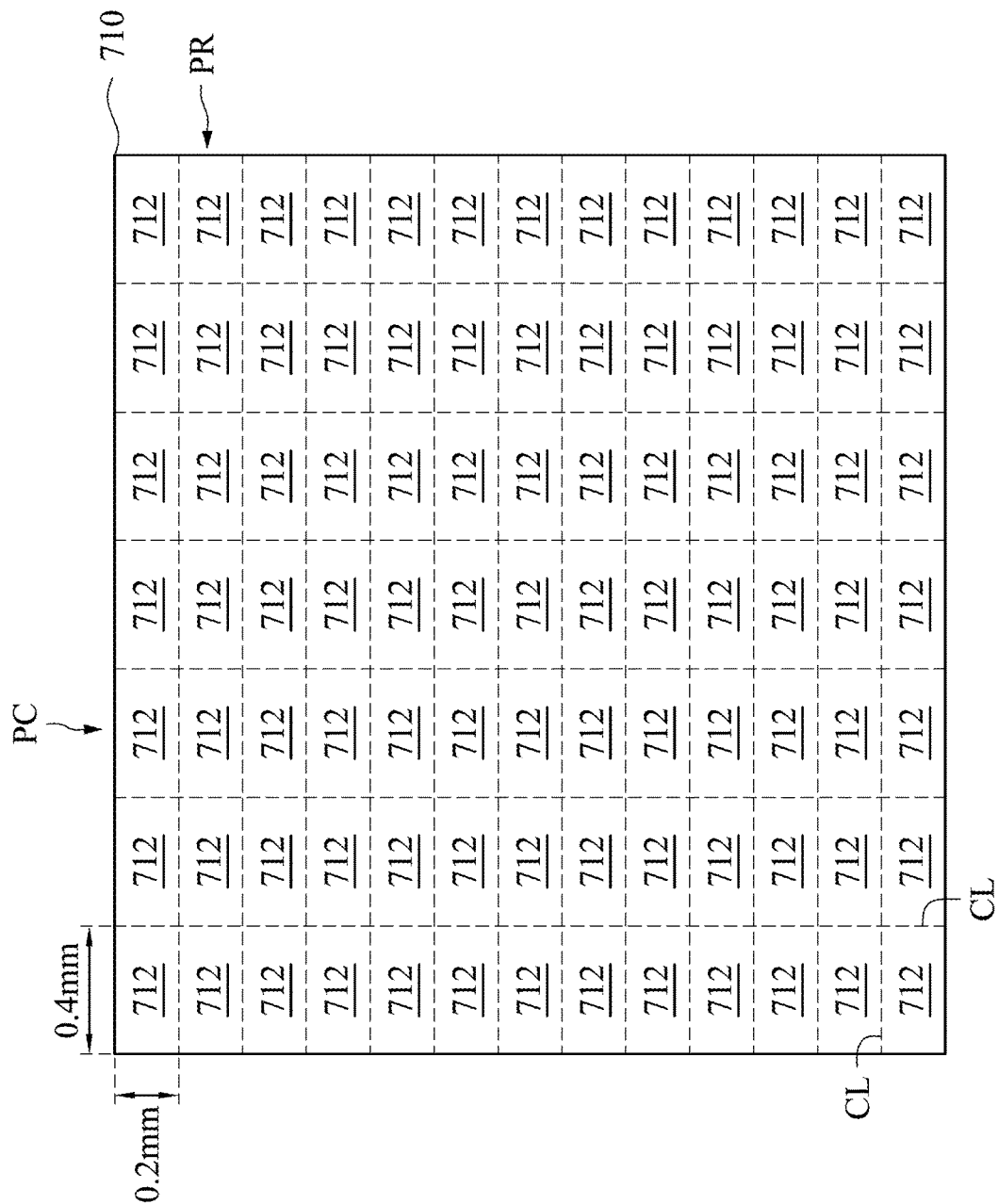
FIG. 7A is a schematic diagram showing a substrate in accordance with an embodiment of the present disclosure.

Referring to FIG. 6, FIG. 6 is a schematic diagram showing a flow chart of a method 600 for fabricating a micro resistance layer in accordance with an embodiment of the present disclosure. The micro resistance layer fabrication method 600 is adapted for fabrication of a micro resistance layer having an area small than or equal to $0.4*0.2$ mm$^2$. In the micro resistance layer fabrication method 600, at first, step 610 is performed to provide a substrate 710, as shown in FIG. 7A. The substrate 610 can be formed by using insulation material, for example glass fibers, Aluminum Nitride material, Silicon-based material or Ceramic material, but embodiments of the present disclosure are not limited thereto. A plurality of product regions 712 are defined on the substrate 710 through a plurality of virtual cutting lines CL. The product region 712 is pre-defined for a product having a resistance layer, for example a resistor or other component having a resistance layer. In this embodiment, the product region 712 has an area small than or equal to $0.4*0.2$ mm$^2$, and the product regions 712 are arranged in a matrix having a plurality of product columns PC and a plurality of product rows PR. In some embodiments, the product region 712 has an area substantially equal to $0.3*0.15$ mm$^2$.

Figure 7B:
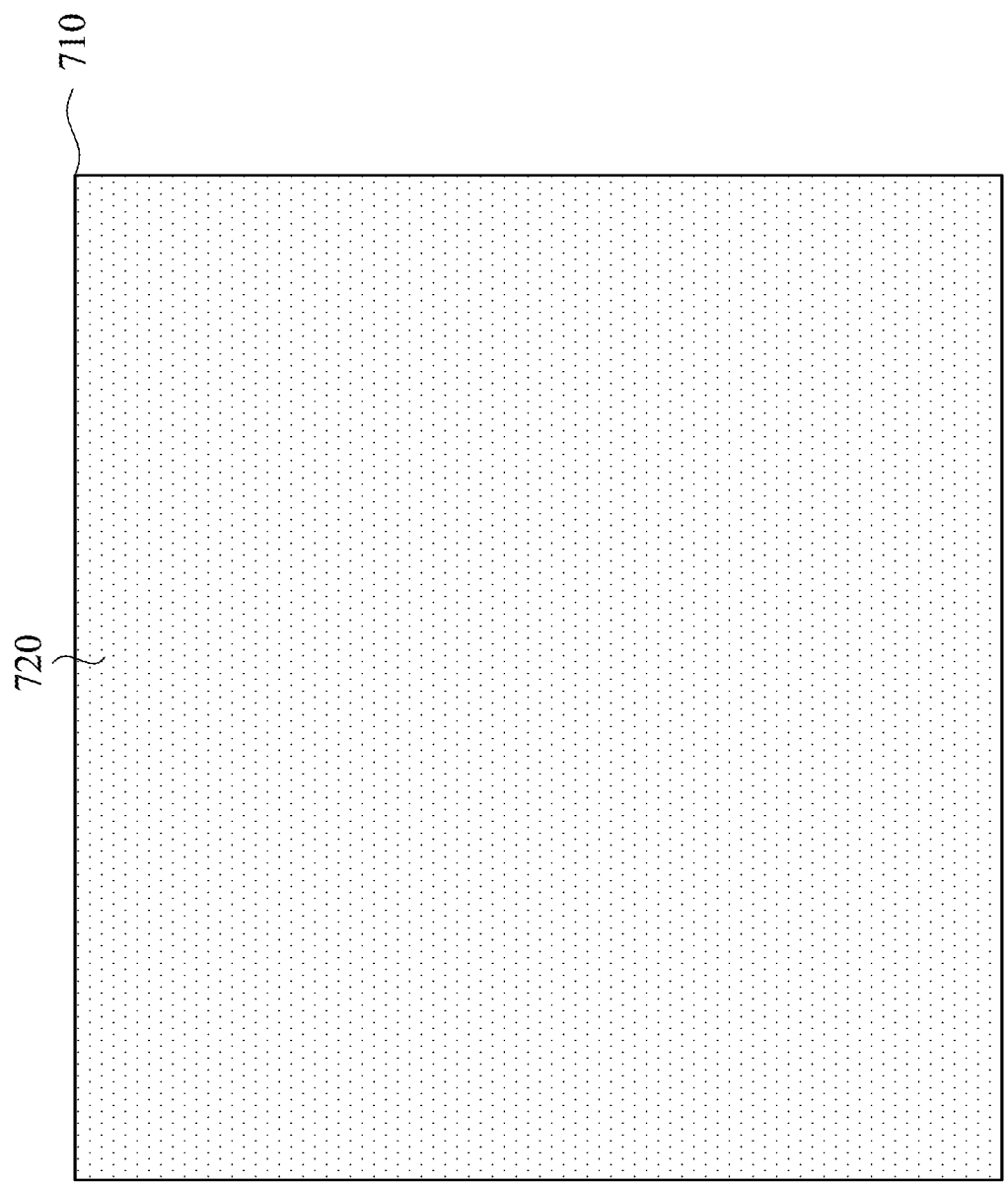
FIG. 7B is a schematic diagram showing a first resistance layer in accordance with an embodiment of the present disclosure.

Then, step 620 is performed to use a sputtering process to form a first resistance layer 720 on the substrate 710, as shown in FIG. 7B. In this embodiment, the sputtering process is used to form the resistance layer 720 covering a whole surface of the substrate 710.

Figure 7C:
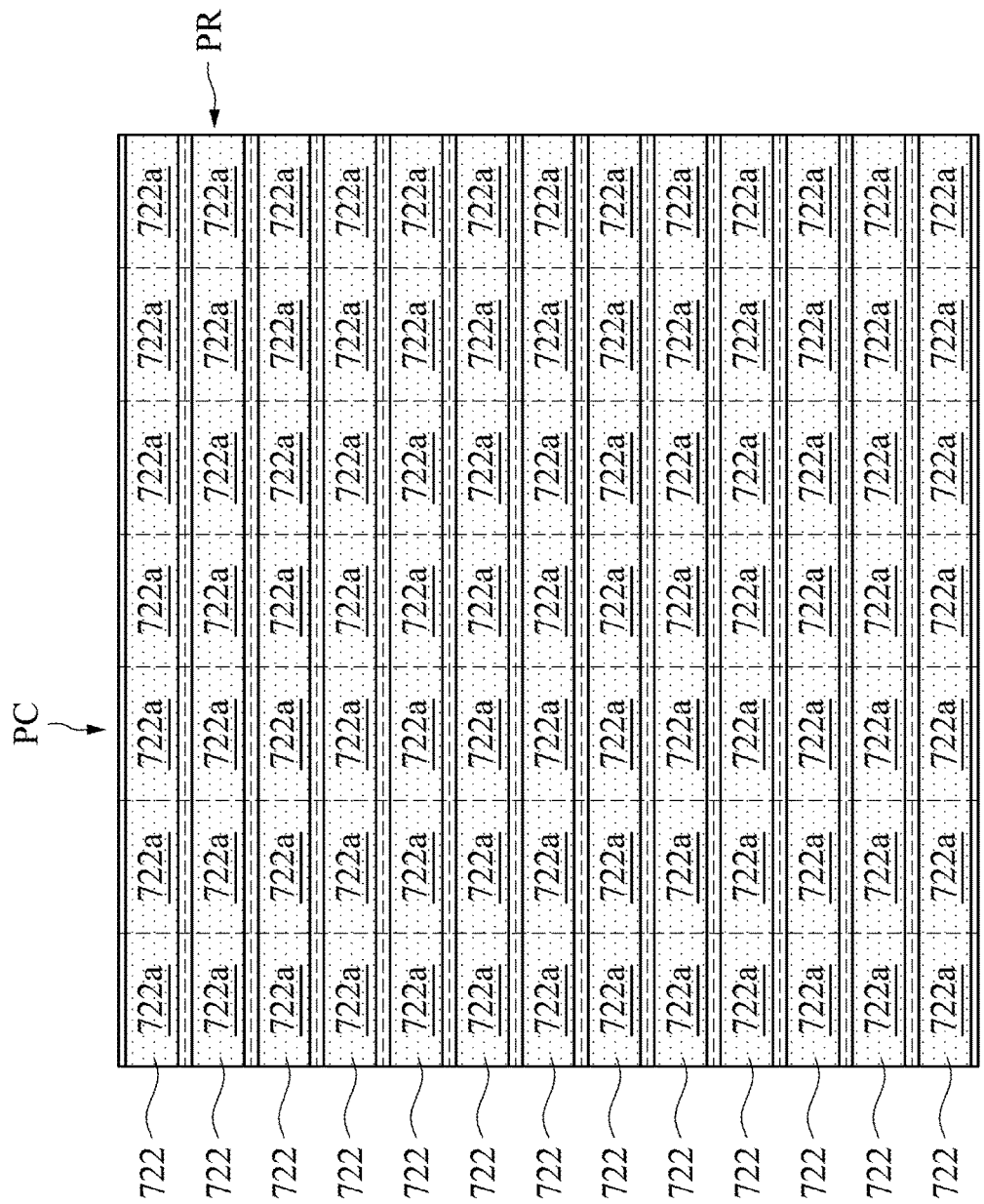
FIG. 7C is a schematic diagram showing second resistance layers in accordance with an embodiment of the present disclosure.
Figure 7D:
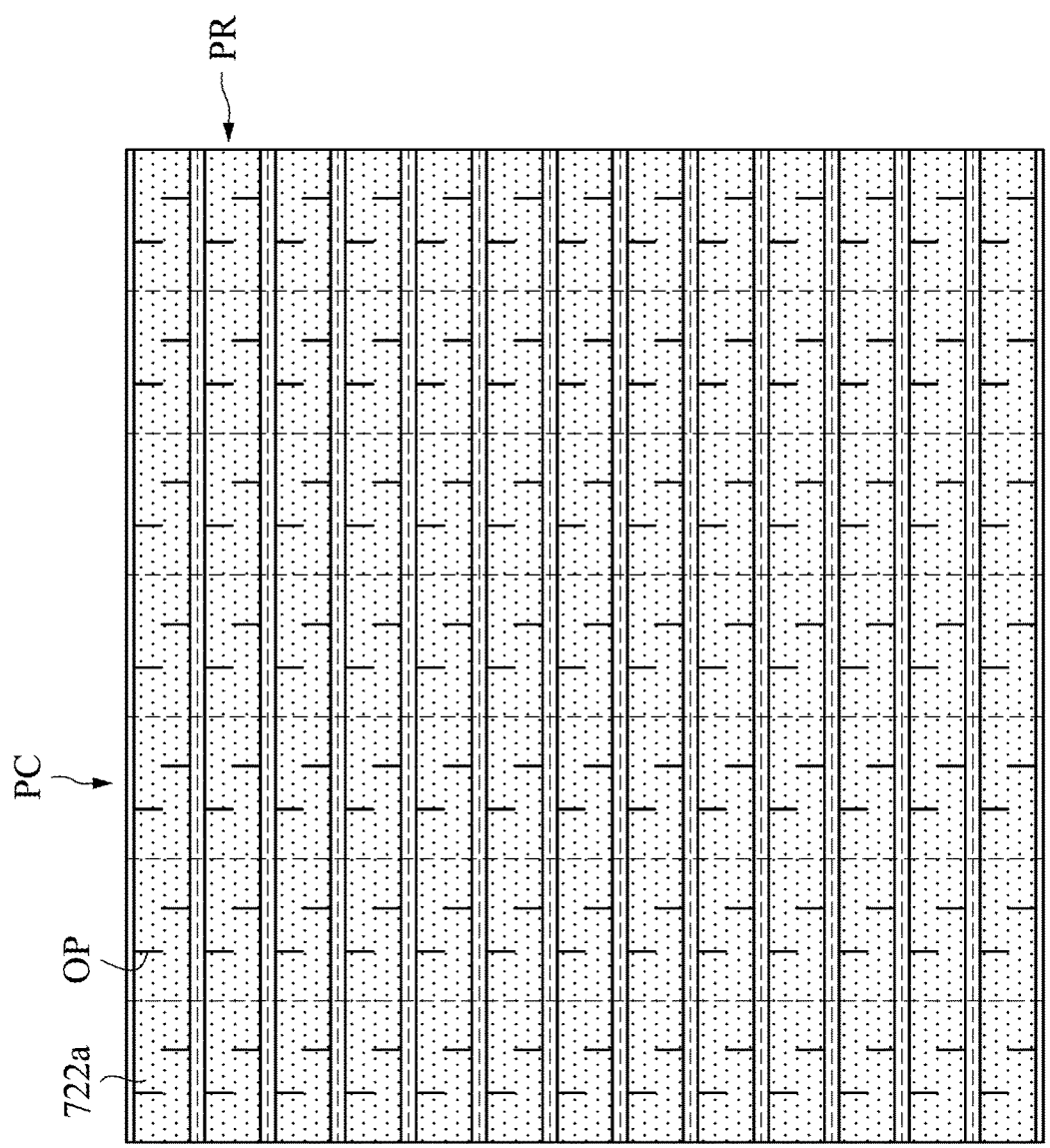
FIG. 7D is a schematic diagram showing pattern trimming of the second resistance layers in accordance with an embodiment of the present disclosure.

Thereafter, step 630 and step 640 are performed to divide the first resistance layer 720 into a plurality of second resistance layer 722a in accordance with the product regions 712, and to trim the second resistance layer 722a. In step 630, each of the sub resistance layers 722 of the first resistance layer 720 is divided into the second resistance layers 722a along a length-direction of the product region 712 as shown in FIG. 7C. Each of the sub resistance layers 722 extends across the product columns PC, and thus the second resistance layer 722a can be defined on each of the sub resistance layers 722 in accordance with the product columns PC to enable each of the product regions 712 to encompass one second resistance layer 722a. In this embodiment, because the product region 712 has an area small than or equal to 0.4*0.2 mm², an area of the second resistance layer 722a of each of the product regions 712 is small than 0.4*0.2 mm². In step 640, a pattern of the second resistance layer 722a of each of the product regions 712 is trimmed in accordance with a predetermined resistance value (for example, forming a long opening OP by cutting the second resistance layer 722a) to enable the pattern of the second resistance layer 722a to be corresponding to the predetermined resistance value as shown in FIG. 7D. In this embodiment, the operations of dividing the first resistance layer 720 and trimming the pattern of the second resistance layer 722a are performed by using a laser, but embodiments of the present disclosure are not limited thereto.

Figure 8:
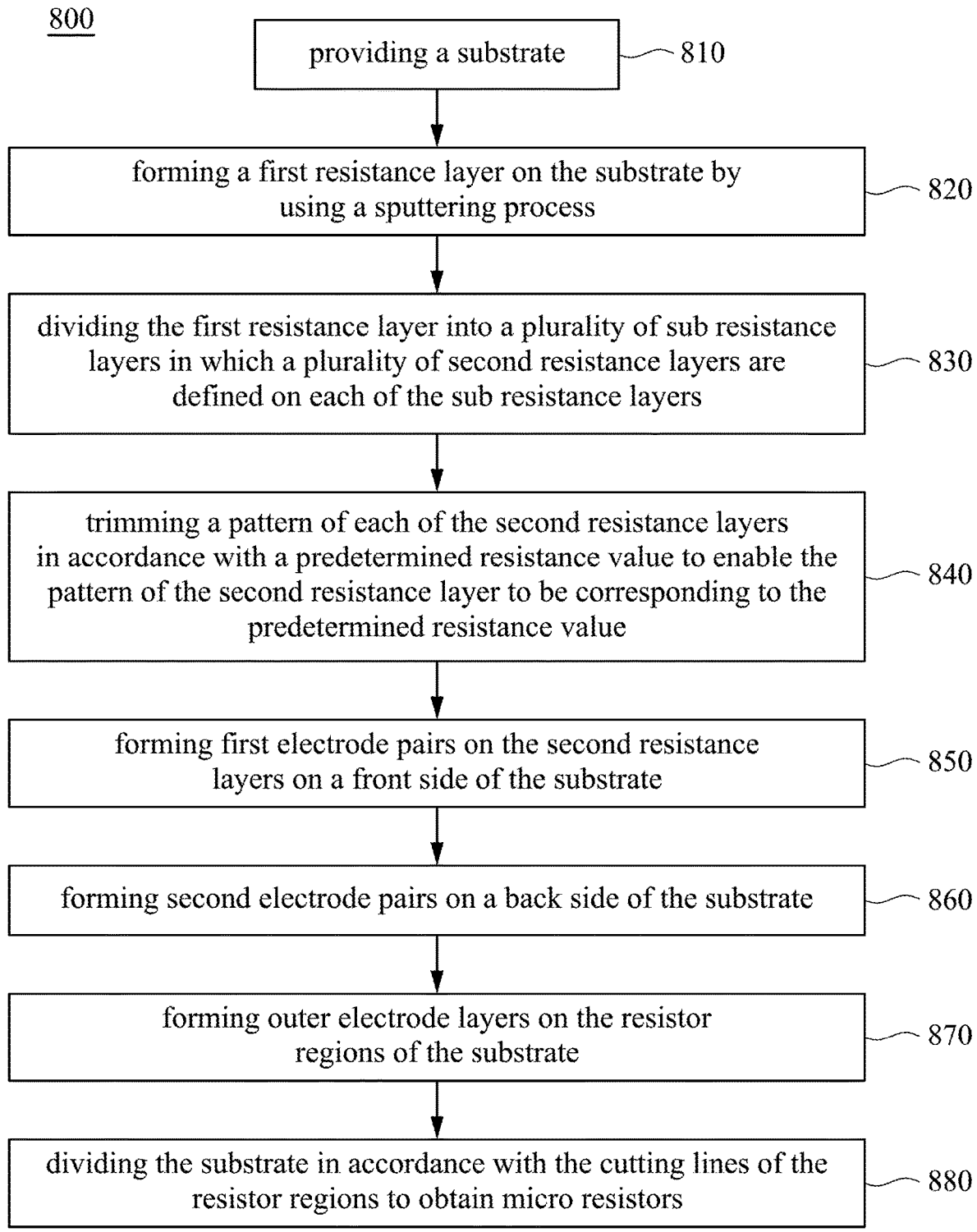
FIG. 8 is a schematic diagram showing a flow chart of a method for fabricating a micro resistor in accordance with an embodiment of the present disclosure.
Figure 9A:
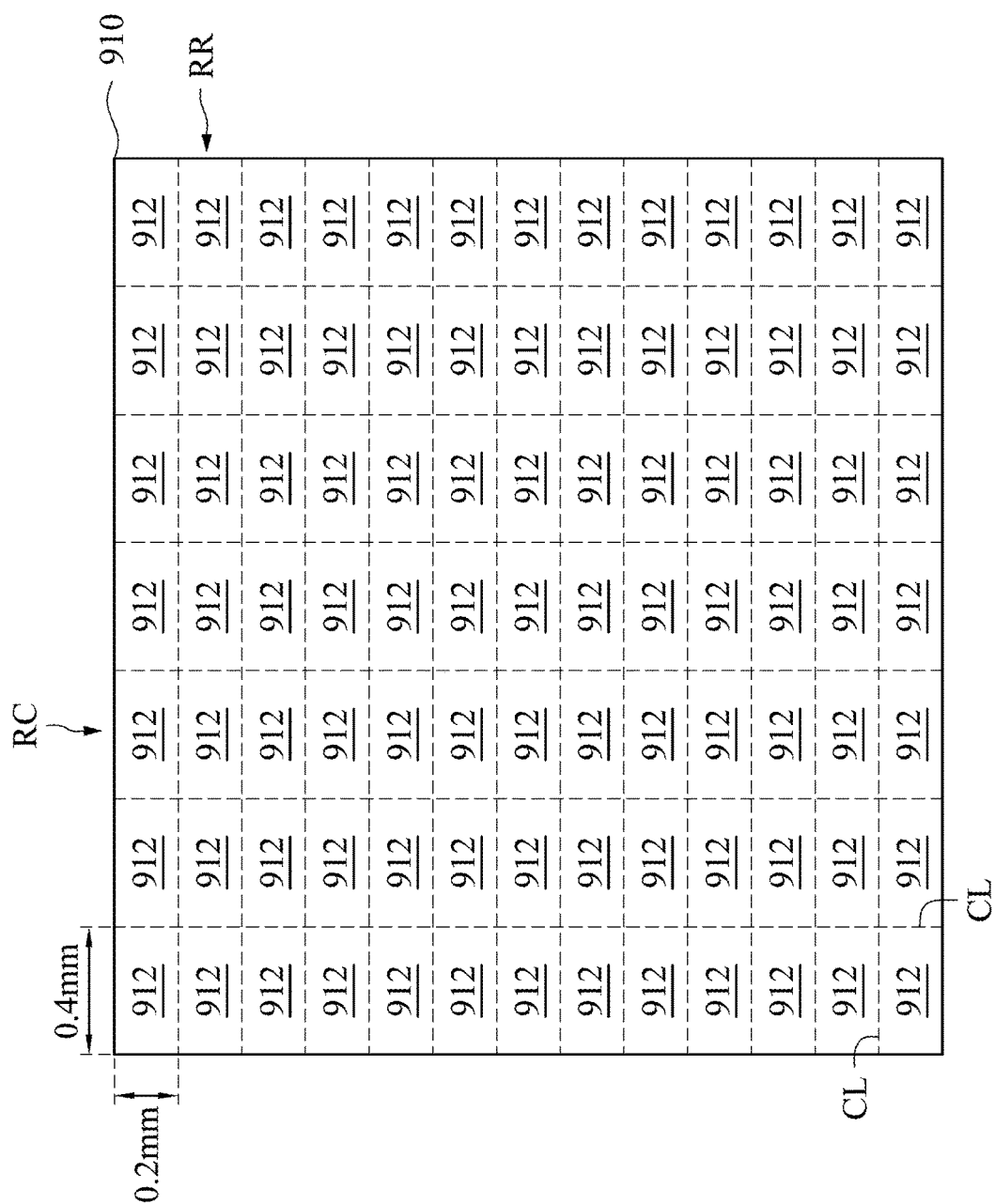
FIG. 9A is a schematic diagram showing a substrate in accordance with an embodiment of the present disclosure.

Referring to FIG. 8, FIG. 8 is a schematic diagram showing a flow chart of a method 800 for fabricating a micro resistor in accordance with an embodiment of the present disclosure. The micro resistor fabrication method 800 uses the above micro resistance layer fabrication method 600 to fabricate a micro resistor such as a 01005 type resistor, a 0075 type resistor or a micro resistor having a smaller size. In the micro resistor fabrication method 800, at first, step 810 is performed to provide a substrate 910, as shown in FIG. 9A. The substrate 910 can be formed by using insulation material, for example glass fibers, Aluminum Nitride material, Silicon-based material or Ceramic material, but embodiments of the present disclosure are not limited thereto. A plurality of resistor regions 912 are defined on the substrate 910 through a plurality of virtual cutting lines CL. The resistor region 912 is pre-defined for a resistor. In this embodiment, the resistor region 912 has an area small than or equal to 0.4*0.2 mm², and the resistor regions 912 are arranged in a matrix having a plurality of resistor columns RC and a plurality of resistor rows RR. In some embodiments, the resistor region 912 has an area substantially equal to 0.3*0.15 mm².

Figure 9B:
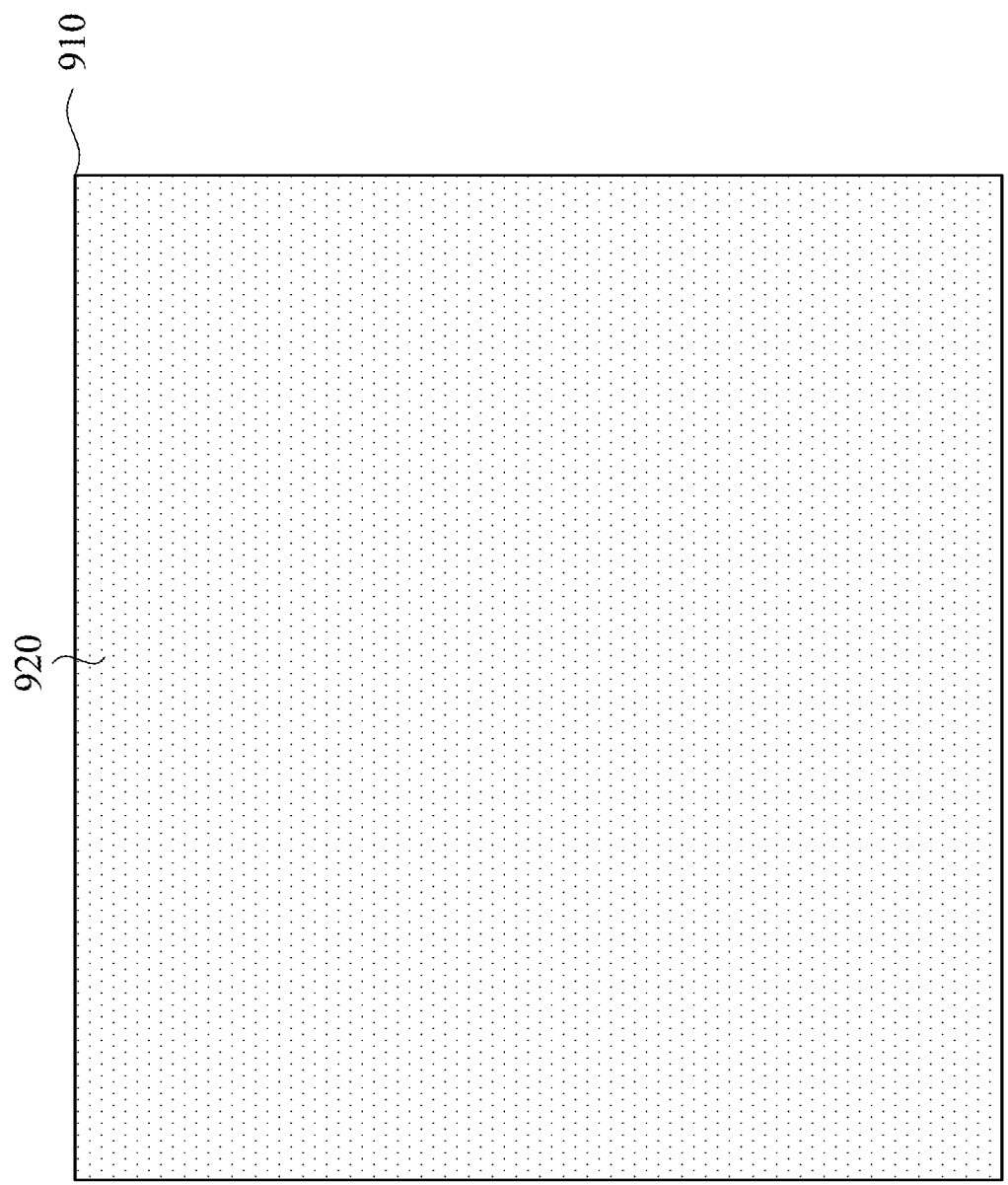
FIG. 9B is a schematic diagram showing first electrode pairs in accordance with an embodiment of the present disclosure.

Then, step 820 is performed to use a sputtering process to form a first resistance layer 920 on the substrate 910, as shown in FIG. 9B. In this embodiment, the sputtering process is used to form the resistance layer 920 covering a whole surface of the substrate 910 (for example, a front side of the substrate 910).

Figure 9C:
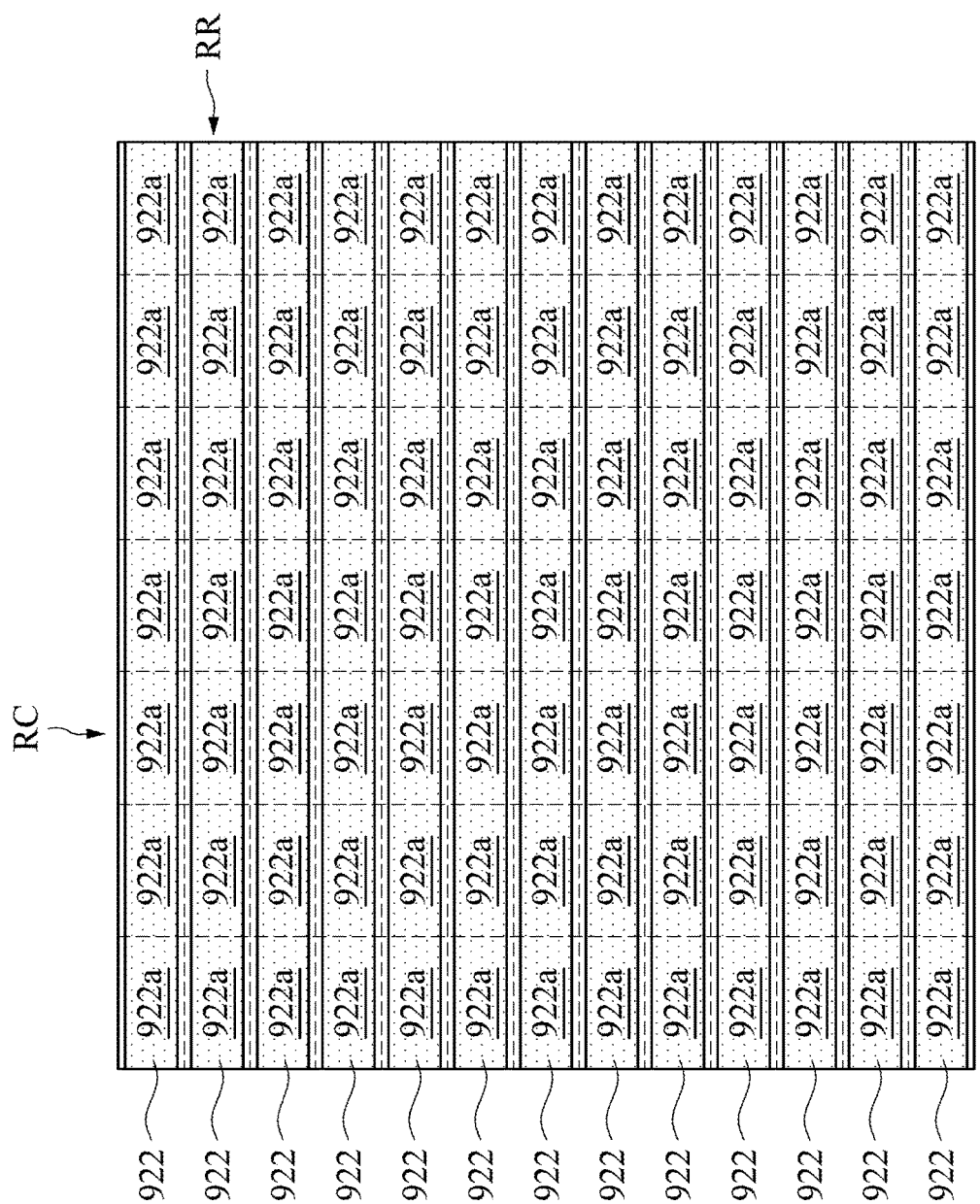
FIG. 9C is a schematic diagram showing second electrode pairs in accordance with an embodiment of the present disclosure.
Figure 9D:
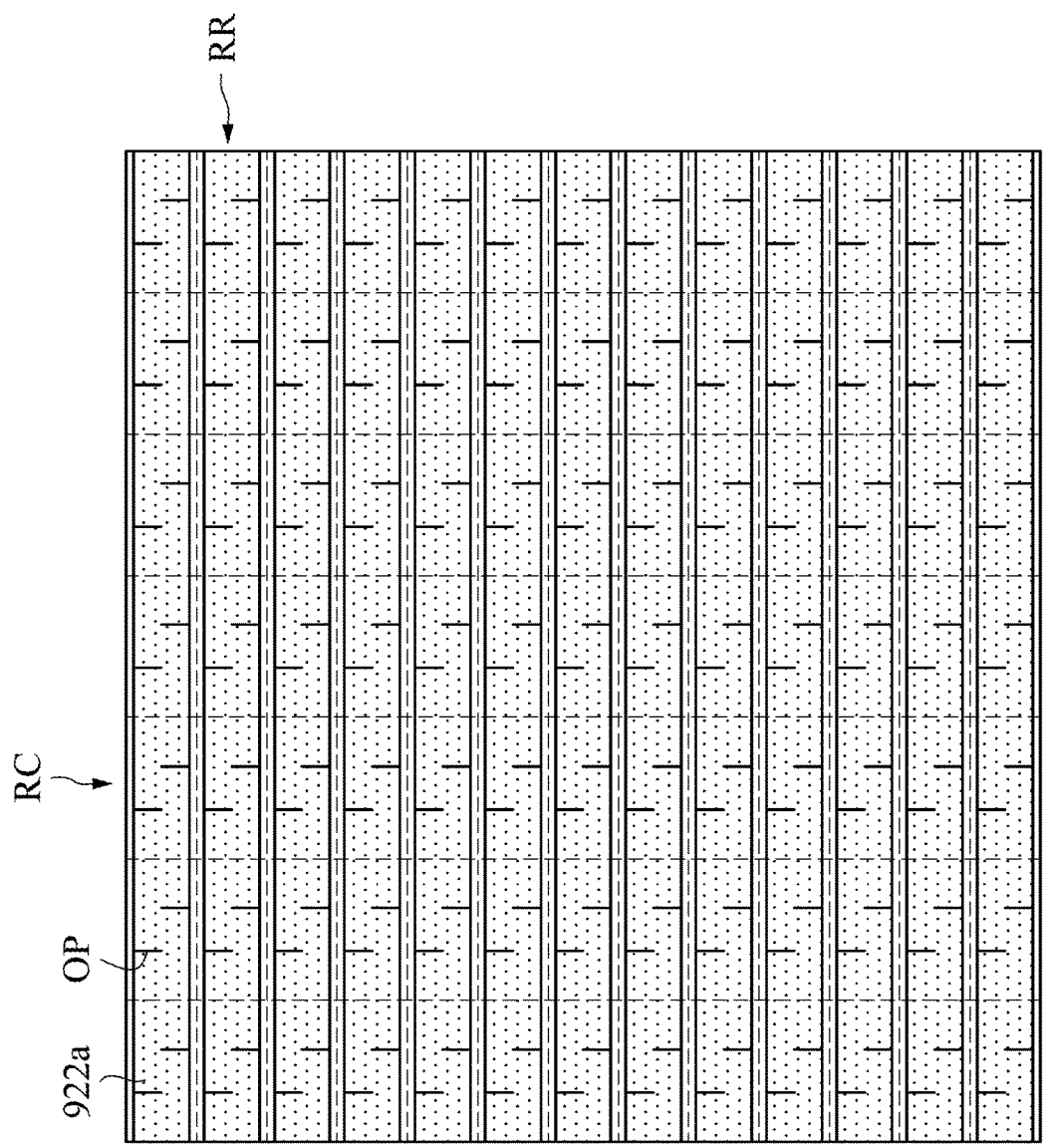
FIG. 9D is a schematic diagram showing a first resistance layer in accordance with an embodiment of the present disclosure.

Thereafter, step 830 and step 840 are performed to divide the first resistance layer 920 into a plurality of second resistance layer 922a in accordance with the resistor regions 912, and to trim the second resistance layer 922a. In step 830, each of the sub resistance layers 922 of the first resistance layer 920 is divided into the second resistance layers 922a along a length-direction of the resistor region 912 as shown in FIG. 9C. Each of the sub resistance layers 922 extends across the resistor columns RC, and thus the second resistance layer 922a can be defined on each of the sub resistance layers 922 in accordance with the resistor columns RC to enable each of the resistor regions 912 to encompass one second resistance layer 922a. In this embodiment, because the resistor region 912 has an area small than or equal to 0.4*0.2 mm², an area of the second resistance layer 922a of each of the resistor regions 912 is small than 0.4*0.2 mm². In step 840, a pattern of the second resistance layer 922a of each of the resistor regions 912 is trimmed in accordance with a predetermined resistance value (for example, forming a long opening OP by cutting the second resistance layer 922a) to enable the pattern of the second resistance layer 922a to be corresponding to the predetermined resistance value as shown in FIG. 9D. In this embodiment, the operations of dividing the first resistance layer 920 and trimming the pattern of the second resistance layer 922a are performed by using a laser, but embodiments of the present disclosure are not limited thereto.

Figure 9E:
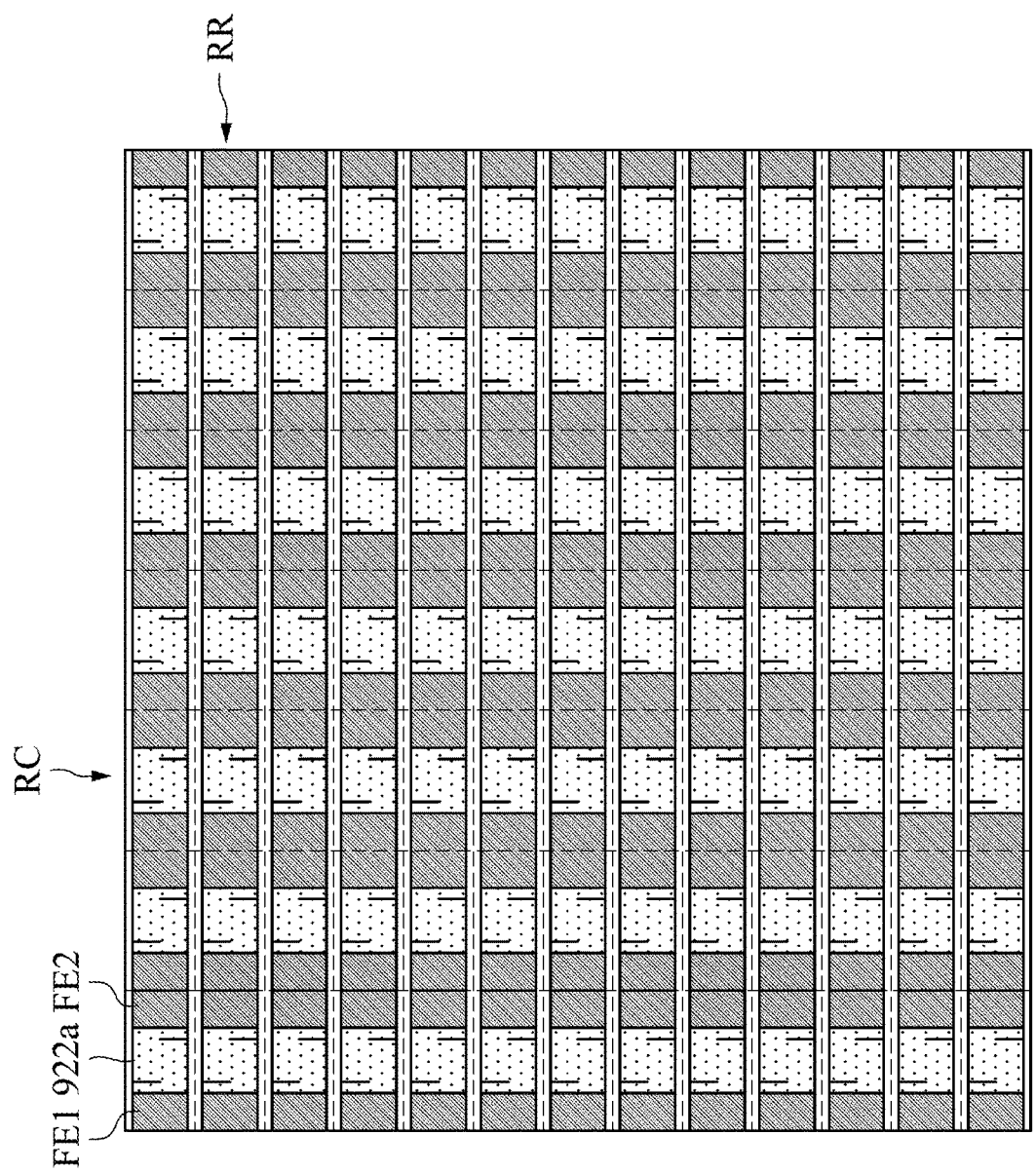
FIG. 9E is a schematic diagram showing second resistance layers in accordance with an embodiment of the present disclosure.
Figure 9F:
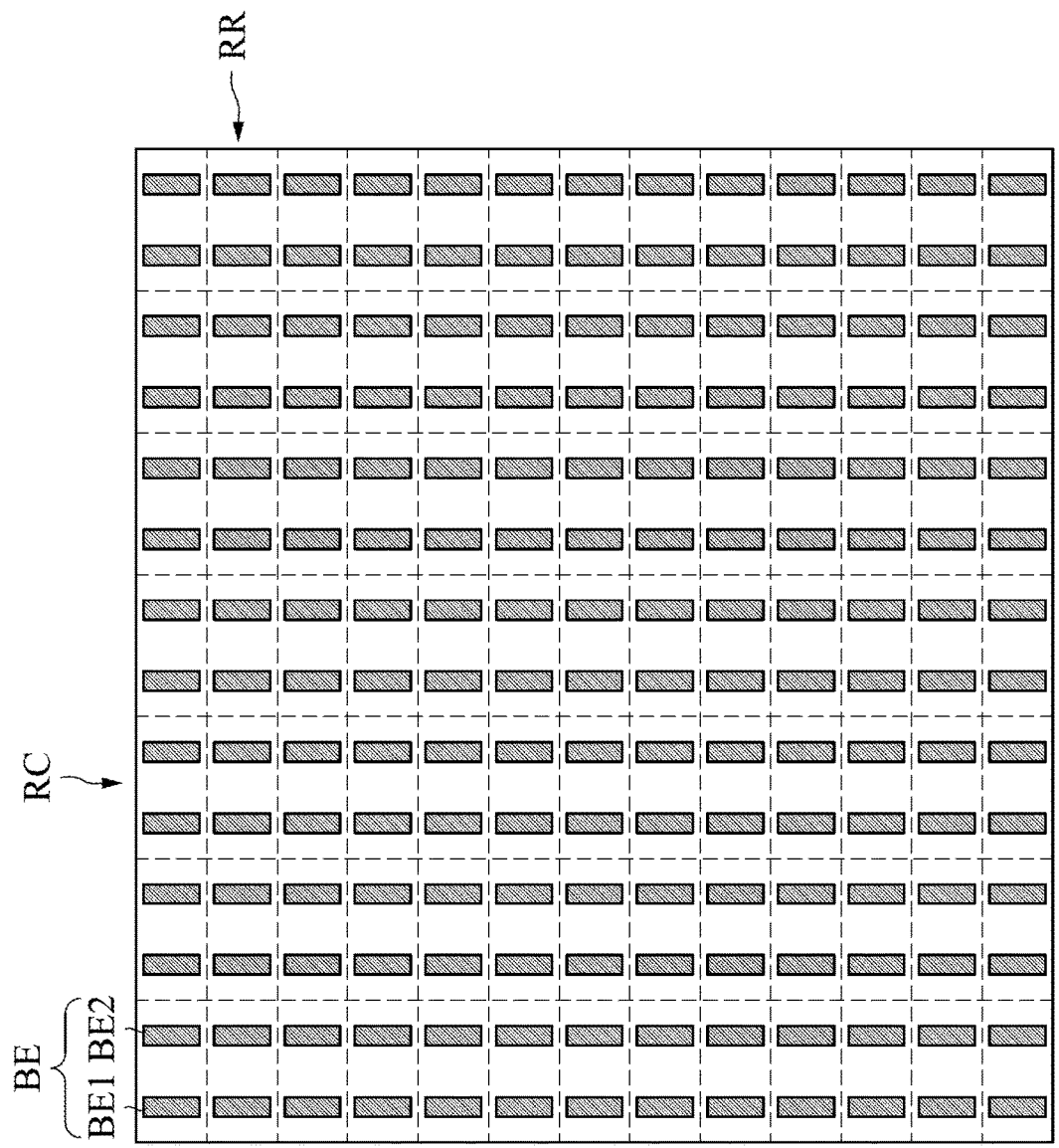
FIG. 9F is a schematic diagram showing pattern trimming of the second resistance layers in accordance with an embodiment of the present disclosure.

Then, step 850 and 860 are performed to form a plurality of first electrode pairs FE and second electrode pairs BE respectively on a front side and a backside of the substrate 910, as shown in FIG. 9E and FIG. 9F. In this embodiment, each of the first electrode pairs FE includes two electrodes FE1 and FE 2 formed on the second resistance layer 922a on the front side of the substrate 910 and covering opposite two terminals of the second resistance layer 922a, as shown in FIG. 9E. The back side of each of the resistor regions 512 encompasses one second electrode pairs BE, and each of the second electrode pairs BE includes two electrodes BE1 and BE 2. Each of the second electrode pairs BE includes two electrodes BE1 and BE 2 formed on the backside of the substrate 910 corresponding to the two electrodes FE1 and FE2, as shown in FIG. 9F.

Figure 9G:
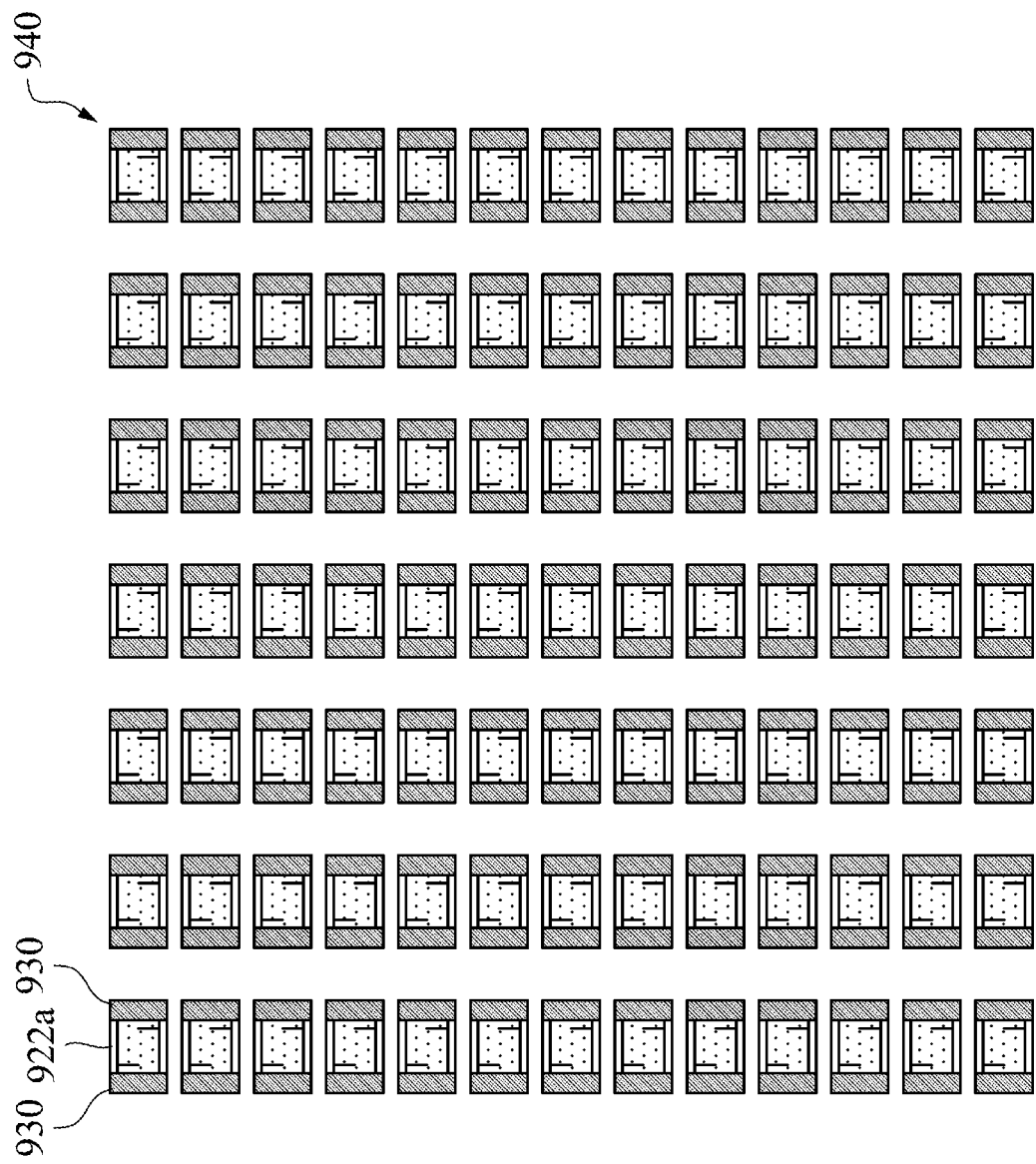
FIG. 9G is a schematic diagram showing micro resistors having second resistance layers in accordance with an embodiment of the present disclosure.

Thereafter, step 870 and step 880 are performed to form outer electrode layers 930 on each of the resistor regions 912, and to divide the resistor regions 912 into a plurality of micro resistors 940 each having an area smaller than 0.4*0.2 mm², as shown in FIG. 9G. In FIG. 9G, the outer electrode layers 930 cover two terminals of the micro resistor 940, and are electrically connected to the first electrode pair FE, the second electrode pair BE and the second resistance layer 922a. For example, the outer electrode layers 930 include side electrode layers, and the side electrode layers extend to the backside of the micro resistor 940 along two terminal sidewalls of the micro resistor 940, to achieve the electric connection between the first electrode pair FE and the second electrode BE.

In some embodiments, the step 870 is performed to divide the substrate 910 into a plurality of substrate strips in accordance with the resistor columns RC, and then to form outer electrode layers 930 on the substrate strips. Then, the step 880 is performed to divide the substrate strips into the micro resistors 940 in accordance with the resistor rows RR.

In some embodiments, the step 870 is performed to form the outer electrode layers 930 in each of the resistor regions 912, in which the substrate 910 is not divided. Then, the step 880 is performed to divide the substrate 910 into the micro resistors 940 in accordance with the resistor rows RR.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for fabricating a micro resistance layer, comprising:

providing a substrate, wherein a plurality of product regions are defined on the substrate, and an area of each of the product regions is smaller than or equal to 0.4*0.2 mm²;

forming a first resistance layer on the substrate by using a screen printing process, wherein the first resistance layer covers the product regions;

dividing the first resistance layer into a plurality of second resistance layers, wherein each of the product regions encompasses one of the second resistance layers, and an area of each of the second resistance layers is smaller than 0.4*0.2 mm$^2$; and trimming a pattern of each of the second resistance layers in accordance with a predetermined resistance value to enable the pattern of each one of the second resistance layers to correspond to the predetermined resistance value.

2. The method of claim 1, wherein the screen printing process is performed by using a fully-open screen.

3. The method of claim 1, wherein dividing the first resistance layer into the second resistance layers is performed by using a laser.

4. The method of claim 1, wherein trimming the pattern of each of the second resistance layers in accordance with a predetermined resistance value to enable the pattern of each one of the second resistance layers to correspond to the predetermined resistance value is performed by using a laser.

5. A method for fabricating a micro resistor, comprising:
providing a substrate, wherein the substrate has a first surface and a second surface opposite to the first surface, a plurality of resistor regions are defined on the substrate, and an area of each of the resistor regions is smaller than or equal to 0.4*0.2 mm$^2$;

forming a plurality of first inner electrode pairs on the first surface, wherein each of the resistor regions encompasses one of the first inner electrode pairs;

forming a plurality of second inner electrode pairs on the second surface, wherein each of the resistor regions encompasses one of the second inner electrode pairs;

forming a first resistance layer on the first surface of the substrate by using a screen printing process to cover the resistor regions;

dividing the first resistance layer into a plurality of second resistance layers, wherein each of the resistor regions encompasses one of the second resistance layers, and each of the second resistance layers is smaller than 0.4*0.2 mm$^2$;

trimming a pattern of the second resistance layer of each of the resistor regions in accordance with a predetermined resistance value to enable the pattern of the second resistance layer of each of the resistor regions to correspond to the predetermined resistance value;

dividing the substrate into a plurality of substrate strips in accordance with the resistor regions;

forming an outer electrode layer on each of the substrate strips, wherein the outer electrode layer comprises a side electrode layer, and is electrically connected to the first inner electrode pair, the second inner electrode pair and the second resistance layer of each of the resistor regions; and dividing each of the substrate strips in accordance with the resistor regions to obtain a plurality of micro resistors each having an area smaller than or equal to 0.4*0.2 mm$^2$.

6. The method of claim 5, wherein dividing the first resistance layer into the second resistance layers is performed by using a laser.

7. The method of claim 5, wherein trimming the pattern of the second resistance layer of each of the resistor regions in accordance with the predetermined resistance value is performed by using a laser.

8. The method of claim 5, wherein the screen printing process is performed by using a fully-open screen.

9. The method of claim 8, wherein the resistor regions are arranged in a matrix having a plurality of resistor columns and a plurality of resistor rows.

10. The method of claim 9, wherein the fully-open screen comprises a plurality of openings, and an area of each of the openings is determined in accordance with an area of each of the resistor columns of the matrix.

11. A method for fabricating a micro resistor, comprising:
providing a substrate, wherein the substrate has a first surface and a second surface opposite to the first surface, a plurality of resistor regions are defined on the substrate, and an area of each of the resistor regions is smaller than or equal to 0.4*0.2 mm$^2$;

forming a plurality of first inner electrode pairs on the first surface, wherein each of the resistor regions encompasses one of the first inner electrode pairs;

forming a plurality of second inner electrode pairs on the second surface, wherein each of the resistor regions encompasses one of the second inner electrode pairs;

forming a first resistance layer on the first surface of the substrate by using a screen printing process to cover the resistor regions; dividing the first resistance layer into a plurality of second resistance layers, wherein each of the resistor regions encompasses one of the second resistance layers, and each of the second resistance layers is smaller than 0.4*0.2 mm$^2$;

trimming a pattern of the second resistance layer of each of the resistor regions in accordance with a predetermined resistance value to enable the pattern of the second resistance layer of each of the resistor regions to correspond to the predetermined resistance value; performing an outer electrode forming step to form an outer electrode layer in each of the resistor regions, wherein the outer electrode layer comprises a side electrode layer, and is electrically connected to the first inner electrode pair, the second inner electrode pair and the second resistance layer of each of the resistor regions; and dividing the substrate in accordance with the resistor regions to obtain a plurality of micro resistors each having an area smaller than or equal to 0.4*0.2 mm$^2$.

12. The method of claim 11, wherein dividing the first resistance layer into the second resistance layers is performed by using a laser.

13. The method of claim 11, wherein trimming the pattern of the second resistance layer of each of the resistor regions in accordance with the predetermined resistance value is performed by using a laser.

14. The method of claim 11, wherein the resistor regions are arranged in a matrix having a plurality of resistor columns and a plurality of resistor rows.

15. The method of claim 11, wherein the screen printing process is performed by using a fully-open screen.

* * * * *